(12) United States Patent
Matsuo et al.

(10) Patent No.: US 11,460,549 B2
(45) Date of Patent: Oct. 4, 2022

(54) SOLID-STATE IMAGING DEVICE AND IMAGING DEVICE PROVIDED WITH SAME

(71) Applicant: Panasonic Intellectual Property Management Co., Ltd., Osaka (JP)

(72) Inventors: Junichi Matsuo, Osaka (JP); Sei Suzuki, Osaka (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 0 days.

(21) Appl. No.: 16/814,691

(22) Filed: Mar. 10, 2020

(65) Prior Publication Data

US 2020/0213553 A1 Jul. 2, 2020

Related U.S. Application Data

(63) Continuation of application No. PCT/JP2018/029874, filed on Aug. 9, 2018.

(30) Foreign Application Priority Data

Sep. 14, 2017 (JP) .............................. JP2017-176781

(51) Int. Cl.
*G01S 7/481* (2006.01)
*H04N 5/33* (2006.01)
(Continued)

(52) U.S. Cl.
CPC .......... *G01S 7/4816* (2013.01); *G01S 17/894* (2020.01); *H04N 5/33* (2013.01); *H04N 5/3741* (2013.01); *H04N 5/37455* (2013.01)

(58) Field of Classification Search
CPC .... G01S 7/4816; G01S 17/894; G01S 7/4863; H04N 5/33; H04N 5/3741;
(Continued)

(56) References Cited

U.S. PATENT DOCUMENTS

2005/0224842 A1 10/2005 Toyama
2008/0088724 A1 4/2008 Kudoh
(Continued)

FOREIGN PATENT DOCUMENTS

JP 2013-175783 A 9/2013
WO 2017/022220 A1 2/2017

OTHER PUBLICATIONS

International Search Report issued in corresponding International Patent Application No. PCT/JP2018/029874, dated Nov. 6, 2018, with English translation.
(Continued)

*Primary Examiner* — Gevell V Selby
(74) *Attorney, Agent, or Firm* — McDermott Will & Emery LLP

(57) ABSTRACT

A solid-state imaging device includes a plurality of pixels arranged in matrix form, each pixel including a photoelectric converter and a plurality of first transfer electrodes, and a plurality of control lines connected to mutually-corresponding ones of the first transfer electrodes in a plurality of pixels arranged in a specific row. The plurality of pixels include a plurality of first pixels and second pixels. Each of the first pixels includes a floating diffusion layer and a readout circuit. Each of the second pixels shares the floating diffusion layer with one of the first pixels arranged in a column direction. At least some of the plurality of control lines are further connected to the first transfer electrodes of pixels that are arranged adjacent in the column direction to respective ones of the plurality of pixels arranged in the specific row and that share at least one of the floating diffusion layers.

15 Claims, 24 Drawing Sheets

(51) Int. Cl.
*H04N 5/374* (2011.01)
*H04N 5/3745* (2011.01)
*G01S 17/894* (2020.01)

(58) Field of Classification Search
CPC ............... H04N 5/37455; H04N 5/372; H04N 5/37452; H04N 5/2354; H01L 27/14643; H01L 27/14612; H01L 27/14641; H01L 27/14603
See application file for complete search history.

(56) References Cited

U.S. PATENT DOCUMENTS

| | | | |
|---|---|---|---|
| 2009/0050997 A1* | 2/2009 | Mutoh | H01L 27/14641 257/440 |
| 2009/0184349 A1 | 7/2009 | Dungan | |
| 2010/0231774 A1* | 9/2010 | Tashiro | H04N 5/378 348/311 |
| 2011/0019041 A1* | 1/2011 | Ishiwata | H01L 27/14621 348/280 |
| 2011/0181749 A1* | 7/2011 | Yamada | H01L 27/14647 348/222.1 |
| 2015/0215554 A1* | 7/2015 | Toyoguchi | H04N 5/23212 348/301 |
| 2018/0156898 A1 | 6/2018 | Suzuki et al. | |
| 2018/0359434 A1* | 12/2018 | Tanaka | H04N 5/232 |

OTHER PUBLICATIONS

Extended European Search Report dated Oct. 28, 2020 issued in corresponding European Patent Application No. 18856333.2.
Office Action dated Apr. 25, 2022 issued for the corresponding Chinese Patent Application No. 201880050716.9, with English Search Report.

* cited by examiner

SOLID-STATE IMAGING DEVICE AND IMAGING DEVICE PROVIDED WITH SAME

CROSS REFERENCE TO RELATED APPLICATIONS

This application is a U.S. continuation application of PCT International Patent Application Number PCT/JP2018/029874 filed on Aug. 9, 2018, claiming the benefit of priority of Japanese Patent Application Number 2017-176781 filed on Sep. 14, 2017, the entire contents of which are hereby incorporated by reference.

BACKGROUND

1. Technical Field

The present disclosure relates to a solid-state imaging device that obtains an image of a subject.

2. Description of the Related Art

A solid-state imaging device that obtains an image of a subject by receiving light from the subject has been known for some time (e.g., see Japanese Unexamined Patent Application Publication No. 2013-175783).

Citation List

SUMMARY

To increase the sensitivity characteristics in a solid-state imaging device, it is desirable to increase the ratio of the area of openings for taking in light in a pixel to the area of the pixel.

Accordingly, an object of the present disclosure is to provide a solid-state imaging device and an imaging device that can increase the ratio of an opening in a pixel to the area of the pixel.

A solid-state imaging device according to one aspect of the present disclosure includes: a plurality of pixels arranged in matrix form on a semiconductor substrate, each of the pixels including a photoelectric converter that converts received light into a signal charge, and a plurality of first transfer electrodes that accumulate and transfer the signal charge read out from the photoelectric converter; and a plurality of control lines connected to mutually-corresponding ones of the first transfer electrodes in a plurality of pixels arranged in a specific row in the arrangement of the plurality of pixels. The plurality of pixels include a plurality of first pixels and a plurality of second pixels. Each of the plurality of first pixels further includes a floating diffusion layer that accumulates the transferred signal charge, and a readout circuit that reads out the signal charge accumulated in the floating diffusion layer. Each of the second pixels shares the floating diffusion layer with one of the first pixels arranged in a column direction of the arrangement of the plurality of pixels. At least some of the plurality of control lines are further connected to at least one of the first transfer electrodes of pixels that are arranged adjacent in the column direction to respective ones of the plurality of pixels arranged in the specific row and that share at least one of the floating diffusion layers.

An imaging device according to another aspect of the present disclosure includes the above-described solid-state imaging device, a light source that emits infrared light in pulses at a plurality of timings in each of exposure periods within a single frame period, and a processor that generates a range image based on a signal read out by the readout circuit.

According to the solid-state imaging device and imaging device configured as described above, the ratio of an opening in a pixel to the area of the pixel can be increased more than in the past.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Circumstances Leading to Realization of One Embodiment of the Present Disclosure Recently, smartphones, game consoles, and the like are being provided with rangefinding cameras, which detect movement in a subject's (a person's) body, hand, or the like by irradiating a space to be captured with infrared light, for example. The Time of Flight (TOF) technique is known as one principle of operations under which a subject distance is detected using a rangefinding camera.

Figure 22:
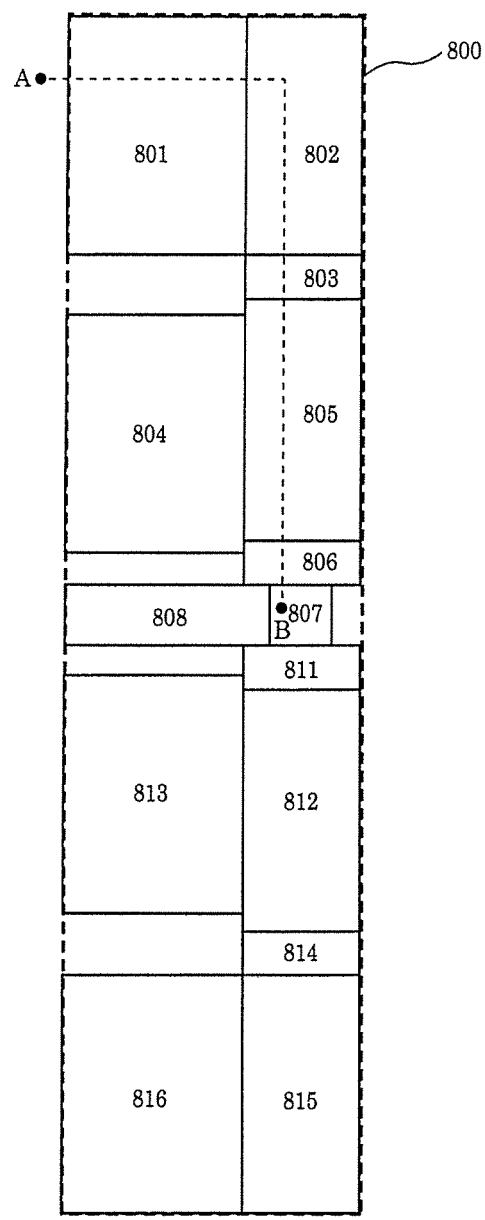
FIG. 22 is a plan view of a pixel in a solid-state imaging device according to related art.

FIG. 22 is a plan view of a pixel in a solid-state imaging device according to the related art disclosed in Japanese Unexamined Patent Application Publication No. 2013-175783.

In FIGS. 22, 801, 804, 813, and 816 indicate photoelectric converters, 802, 805, 812, and 815 indicate charge holders, 803, 806, 811, and 814 indicate charge transferrers, 807 indicates a floating diffusion, and 808 collectively indicates other elements such as readout circuits and the like.

Figure 23:
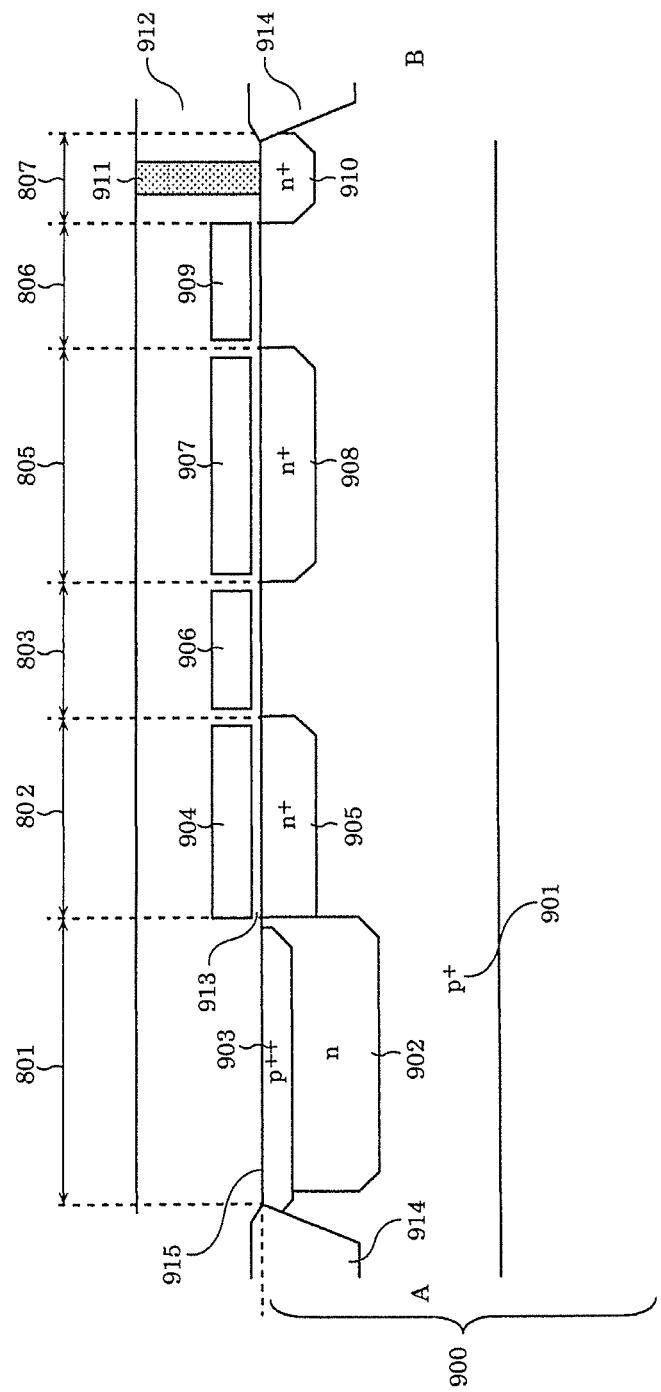
FIG. 23 is a cross-sectional view of a pixel in the solid-state imaging device according to related art.

FIG. 23 is a cross-sectional view of the pixel in the solid-state imaging device according to the related art. In FIGS. 23, 904 and 907 indicate gate electrodes of the charge holders, 906 and 909 indicate gate electrodes of the charge transferrers, and 910 indicates the floating diffusion.

Figure 24:
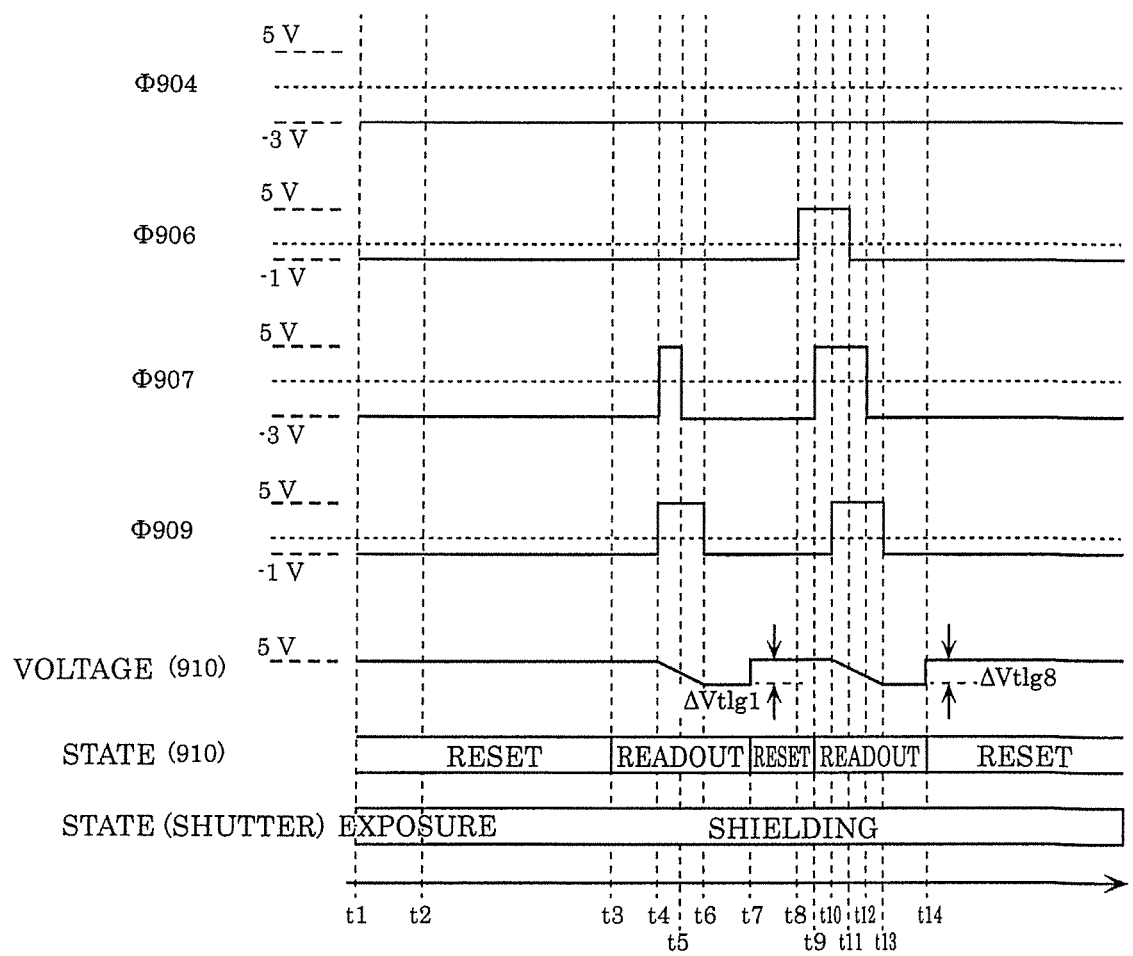
FIG. 24 is a timing chart of various types of signals in the solid-state imaging device according to related art.

FIG. 24 is a timing chart of various types of signals in the solid-state imaging device according to the related art. FIG. 24 illustrates a period for transferring a signal charge generated by photoelectric converters 801 and 804 to floating diffusion 807 by applying drive signals Φ904, Φ906, Φ907, and Φ909 to the respective gate electrodes.

With a rangefinding camera that uses the TOF technique, for example, two types of signal charges are generated by emitting infrared light in pulses and receiving light reflected by a subject during two types of exposure periods. The distance to the subject is then found from the ratio of the signal charges.

Japanese Unexamined Patent Application Publication No. 2013-175783 discloses related art in which signal charges from a plurality of pixels are read out from a single floating diffusion and a readout circuit using charge transfers.

However, different drive signals are applied to the respective gate electrodes provided in a pixel that shares a floating diffusion, which means there are more control lines for transmitting the drive signals to the gate electrodes. There is thus an issue in that the openings that take in light cannot be widened sufficiently and the sensitivity characteristics drop as a result.

Additionally, because a solid-state imaging device used in a rangefinding camera exposes all of the pixels simultaneously, it is necessary to use a solid-state imaging device capable of global shutter scanning.

In this case too, the shutter is activated for all pixels simultaneously, which means that a charge accumulator is required for all of the pixels. This results in many control lines for controlling the readout circuit, charge accumulators, and the like being provided in the pixels. This reduces the size of the openings that take in light, and the sensitivity characteristics drop as a result.

Having extensively investigated the issues described above, the inventors of the present disclosure arrived at a solid-state imaging device that achieves high sensitivity characteristics while reducing the number of control lines for gate electrodes.

Embodiments of the present disclosure will be described hereinafter with reference to the drawings. Although the descriptions will be given with reference to the appended drawings, the descriptions and drawings are merely examples, and are not intended to limit the present disclosure. Elements indicating configurations, operations, and effects which are substantially identical throughout the drawings will be given identical reference signs.

Embodiment 1

Figure 1:
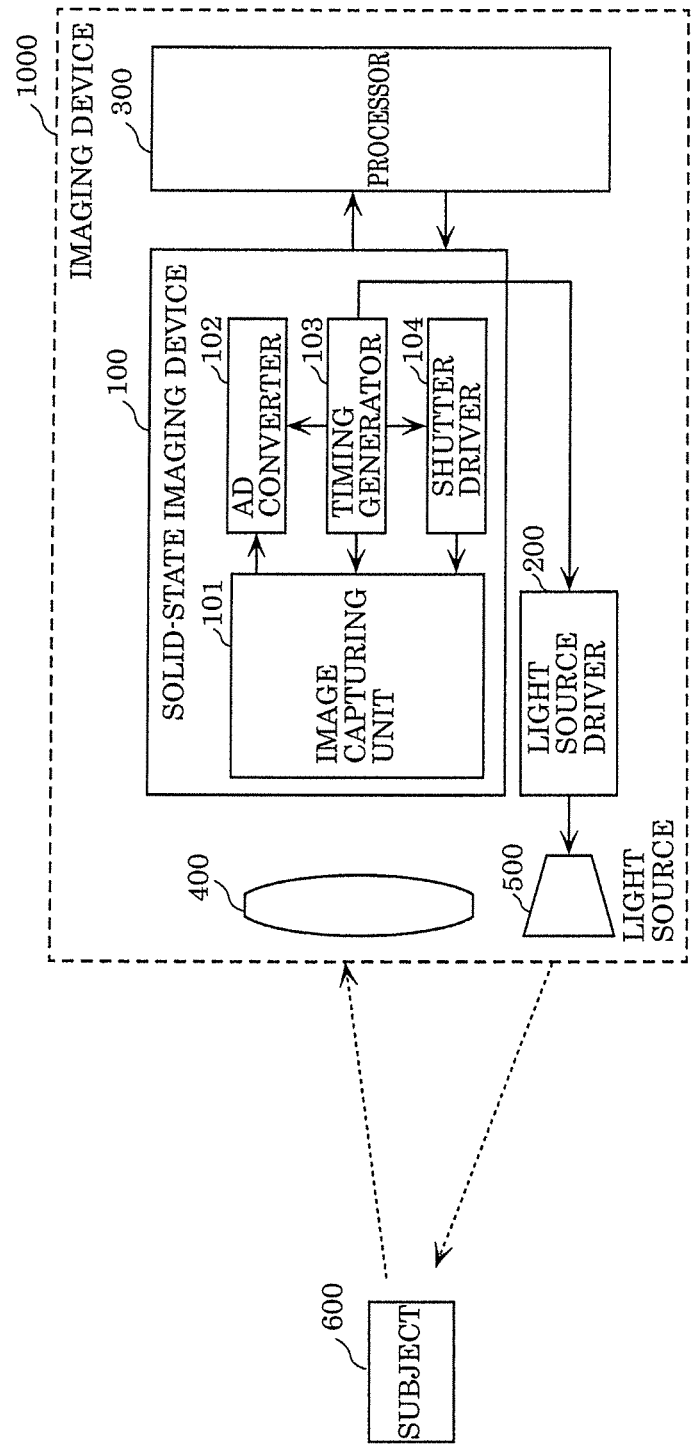
FIG. 1 is a function block diagram illustrating an example of the overall configuration of a rangefinding imaging device according to Embodiment 1.

FIG. 1 is a function block diagram illustrating an example of the overall configuration of imaging device 1000 according to Embodiment 1 of the present disclosure.

As illustrated in FIG. 1, imaging device 1000 includes solid-state imaging device 100, light source driver 200, processor 300, optical lens 400, and light source 500. Solid-state imaging device 100 includes image capturing unit 101, AD converter 102, timing generator 103, and shutter driver 104.

Timing generator 103 drives light source 500 through light source driver 200 by issuing a light emission signal instructing light source 500 to irradiate subject 600 with light (near-infrared light is given as an example here), and also issues an exposure signal instructing image capturing unit 101 to be exposed to light reflected by subject 600.

Image capturing unit 101 includes a plurality of pixels disposed in matrix form on a semiconductor substrate, and exposes a region containing subject 600 a plurality of times in a single frame period in accordance with a timing indicated by the exposure signal issued by timing generator 103 to obtain a signal corresponding to the total exposure amount from the plurality of exposures.

Processor 300 computes the distance to subject 600 based on the signal received from solid-state imaging device 100.

As illustrated in FIG. 1, subject 600 is irradiated with near-infrared light from light source 500, and is also irradiated with background light. Light reflected by subject 600 is incident on image capturing unit 101 through optical lens 400. The reflected light incident on image capturing unit 101 forms an image, and the image formed is then converted to an electrical signal. The operations of light source 500 and solid-state imaging device 100 are controlled by timing generator 103 of solid-state imaging device 100. The output from solid-state imaging device 100 is converted to a range image by processor 300, and depending on the application, is also converted to a visible image. Note that it is not absolutely necessary that processor 300 be provided outside solid-state imaging device 100, and some or all of the functions for calculating distance and so on may be built into solid-state imaging device 100.

What is known as a CMOS image sensor can be given as an example of solid-state imaging device 100.

Figure 2:
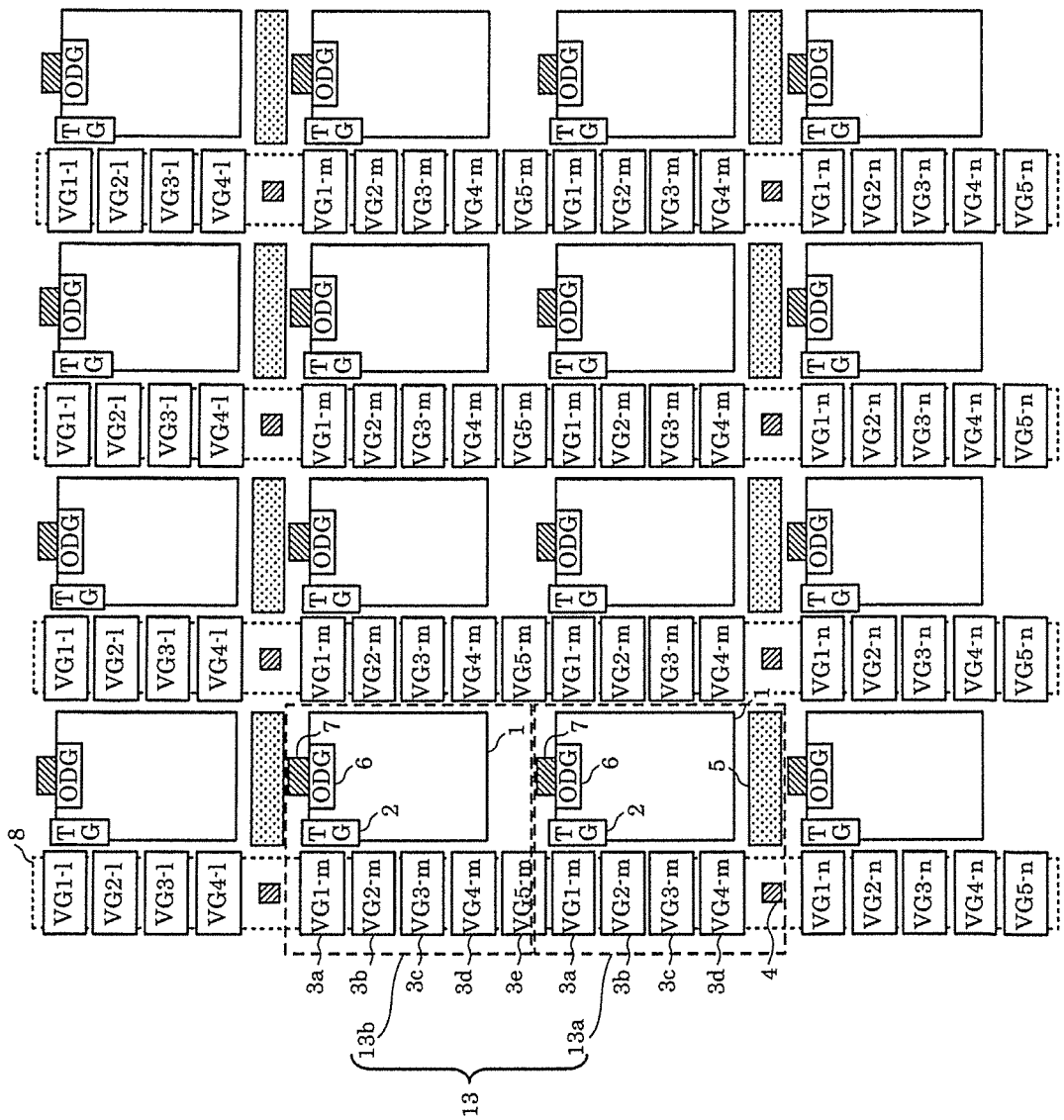
FIG. 2 is a schematic plan view illustrating a layout of pixels included in a solid-state imaging device according to Embodiment 1.

FIG. 2 is a schematic plan view illustrating a layout of pixels 13 included in solid-state imaging device 100 according to Embodiment 1. To simplify the drawing, FIG. 2 illustrates only four pixels in a vertical direction (a column direction of the plurality of pixels 13 disposed in matrix form, i.e., the up-down direction in FIG. 2) and four pixels in a horizontal direction (a row direction of the plurality of pixels 13 disposed in matrix form, i.e., the left-right direction in FIG. 2).

As illustrated in FIG. 2, solid-state imaging device 100 according to Embodiment 1 includes pixels 13 (first pixels 13a and second pixels 13b) arranged in matrix form on a semiconductor substrate.

Each pixel 13 includes photoelectric converter 1, readout electrode 2, a plurality of first transfer electrodes (vertical transfer electrodes) 3, exposure control electrode 6, charge emitter 7, and transfer channel 8.

Each first pixel 13a includes four first transfer electrodes, i.e., first transfer electrodes 3a, 3b, 3c, and 3d, as the plurality of first transfer electrodes 3, and furthermore includes floating diffusion layer 4 (floating diffusion) and readout circuit 5.

On the other hand, each second pixel 13b includes five first transfer electrodes, i.e., first transfer electrodes 3a, 3b, 3c, 3d, and 3e, as the plurality of first transfer electrodes 3, but does not include floating diffusion layer 4 and readout circuit 5 included in first pixel 13a. Each second pixel 13b shares floating diffusion layer 4 with one of first pixels 13a arranged in the column direction of the plurality of pixels 13 arranged in matrix form.

Photoelectric converter 1 converts received light into a signal charge.

Readout electrode 2 reads out the signal charge from photoelectric converter 1.

First transfer electrodes 3 accumulate and transfer the signal charge read out from photoelectric converter 1.

Transfer channel 8 is a channel that accumulates the signal charges, running under each of the plurality of first transfer electrodes 3. A charge accumulator is formed by first transfer electrodes 3 to which a high voltage is applied and transfer channel 8 running under those electrodes. Here, the descriptions will be given assuming that each charge accumulator is driven in five phases as an example.

Floating diffusion layer 4 accumulates the transferred signal charges.

Readout circuit 5 reads out the signal charges accumulated in floating diffusion layer 4.

Due to the five-phase driving, the signal charges accumulated in each charge accumulator are transferred to floating diffusion layer 4 disposed below the charge accumulators in the vertical direction, and are read out to AD converter 102 by readout circuit 5.

Charge emitter 7 emits at least part of the signal charge from photoelectric converter 1.

Exposure control electrode 6 controls the stated emission to charge emitter 7.

As illustrated in FIG. 2, first pixel 13a is, with respect to the column direction, located at one end or another end of two or more pixels arranged in the column direction and sharing at least one floating diffusion layer 4 (here, for example, first pixel 13a and second pixel 13b).

In FIG. 2, first transfer electrodes 3 given the same reference sign (e.g., VG1-$m$, VG2-$m$, VG3-$m$, VG4-$m$, and so on) are connected to the same control line.

Figure 3:
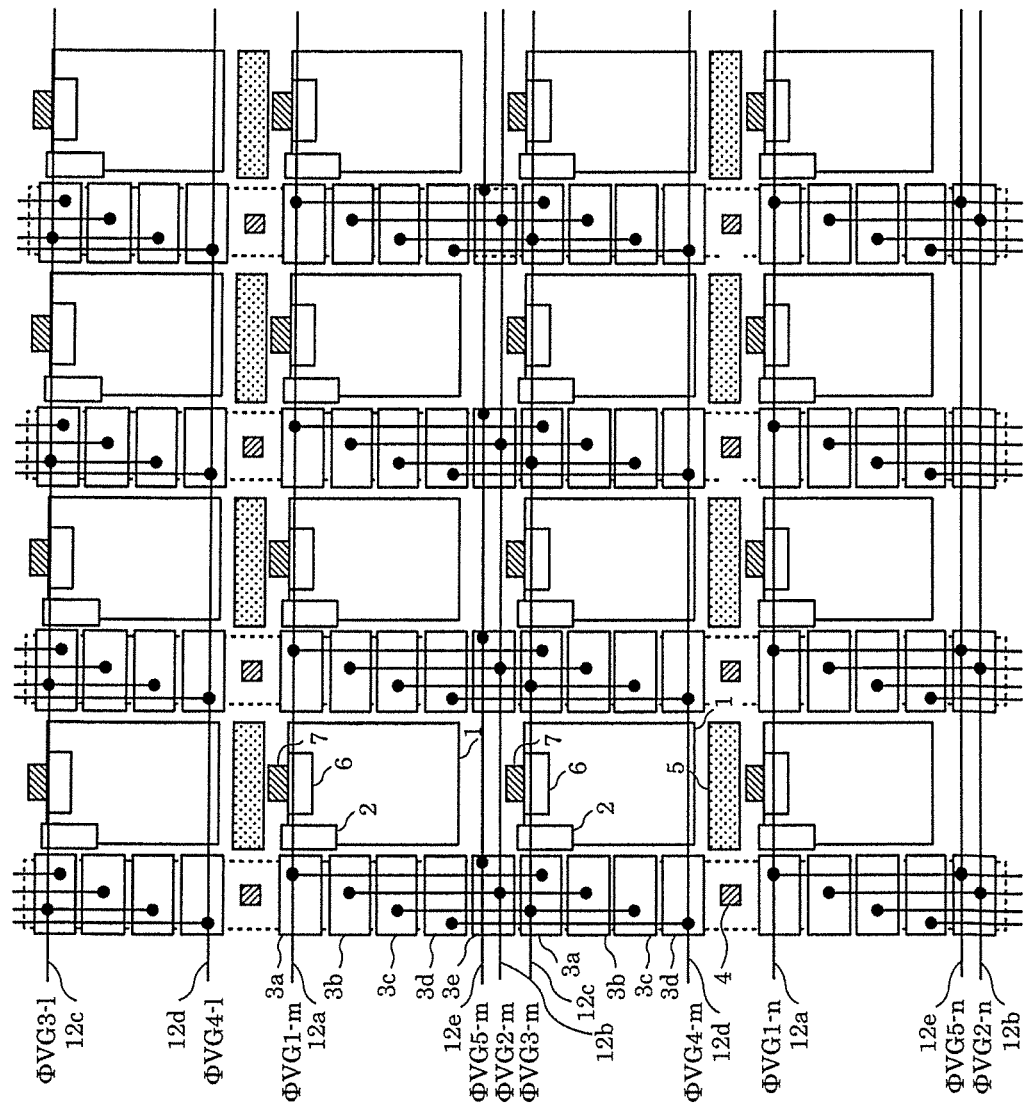
FIG. 3 is a schematic plan view illustrating a layout of control lines included in the solid-state imaging device according to Embodiment 1.

FIG. 3 is a schematic plan view illustrating a layout of control lines 12 connected to first transfer electrodes 3, for pixels 13 included in solid-state imaging device 100 according to Embodiment 1.

As illustrated in FIG. 3, solid-state imaging device 100 includes a plurality of control lines 12 (here, control lines 12a to 12e, for example), each connected to corresponding ones of first transfer electrodes 3 (here, first transfer electrodes 3 given the same reference sign (e.g., VG1-$m$ or the like) in FIG. 2) in a specific row of the plurality of pixels 13 disposed in matrix form (here, the second row from the top, for example). At least some of these control lines 12 (here, control lines 12a to 12d, for example) are further connected to at least one of first transfer electrodes 3 (here, first transfer electrodes 3 to which the same reference sign is assigned) of pixels 13 arranged in the column direction and sharing floating diffusion layer 4, for the plurality of pixels 13 arranged in the specific row (here, pixels 13 in the third row from the top, for example).

As illustrated in FIG. 3, connecting the plurality of first transfer electrodes 3 provided in a plurality (e.g., two) pixels 13 arranged in the vertical direction reduces the number of control lines 12 provided in the horizontal direction.

Figure 4:
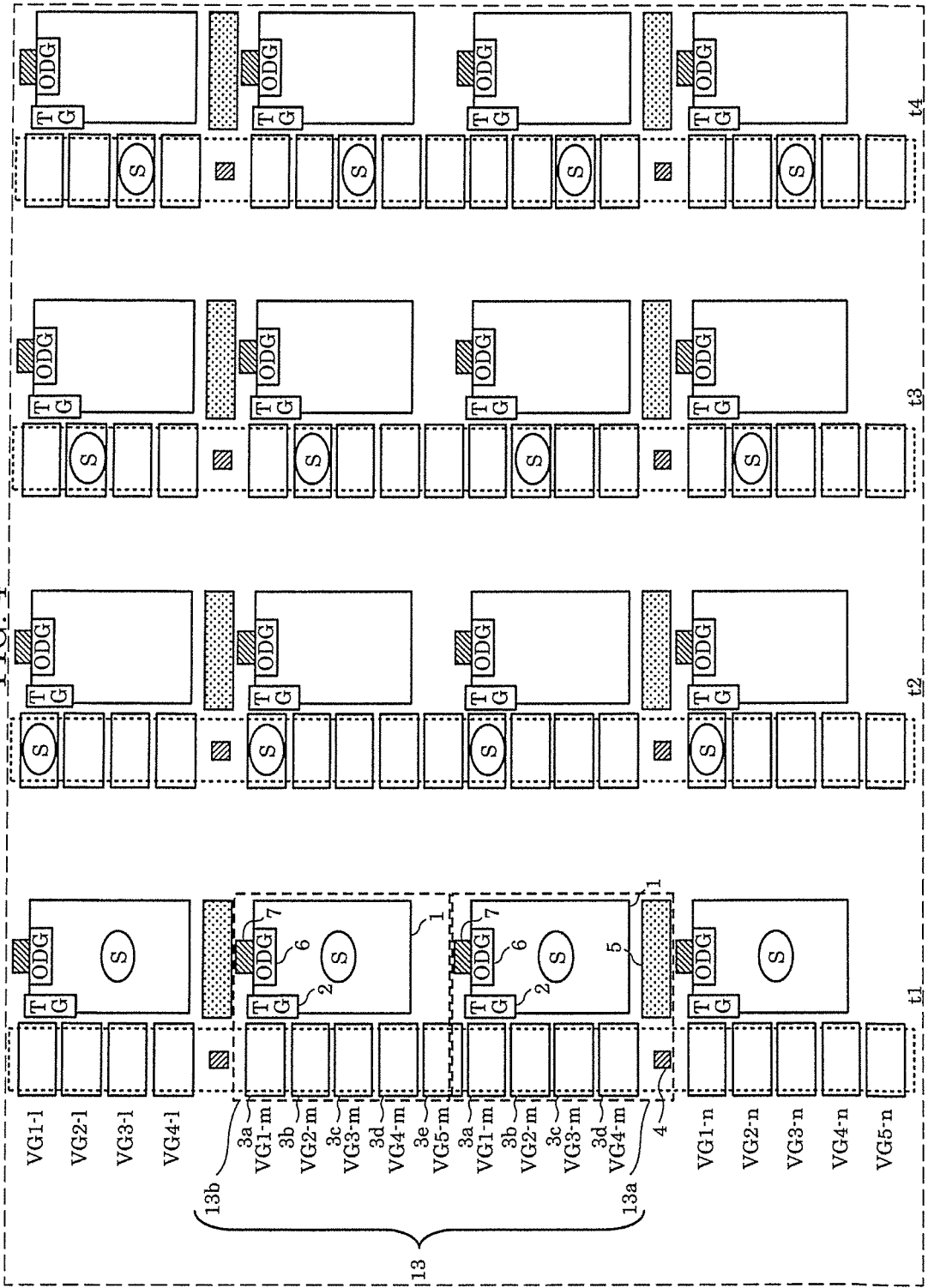
FIG. 4 is a schematic plan view illustrating operations in an exposure period of the solid-state imaging device according to Embodiment 1.
Figure 5:
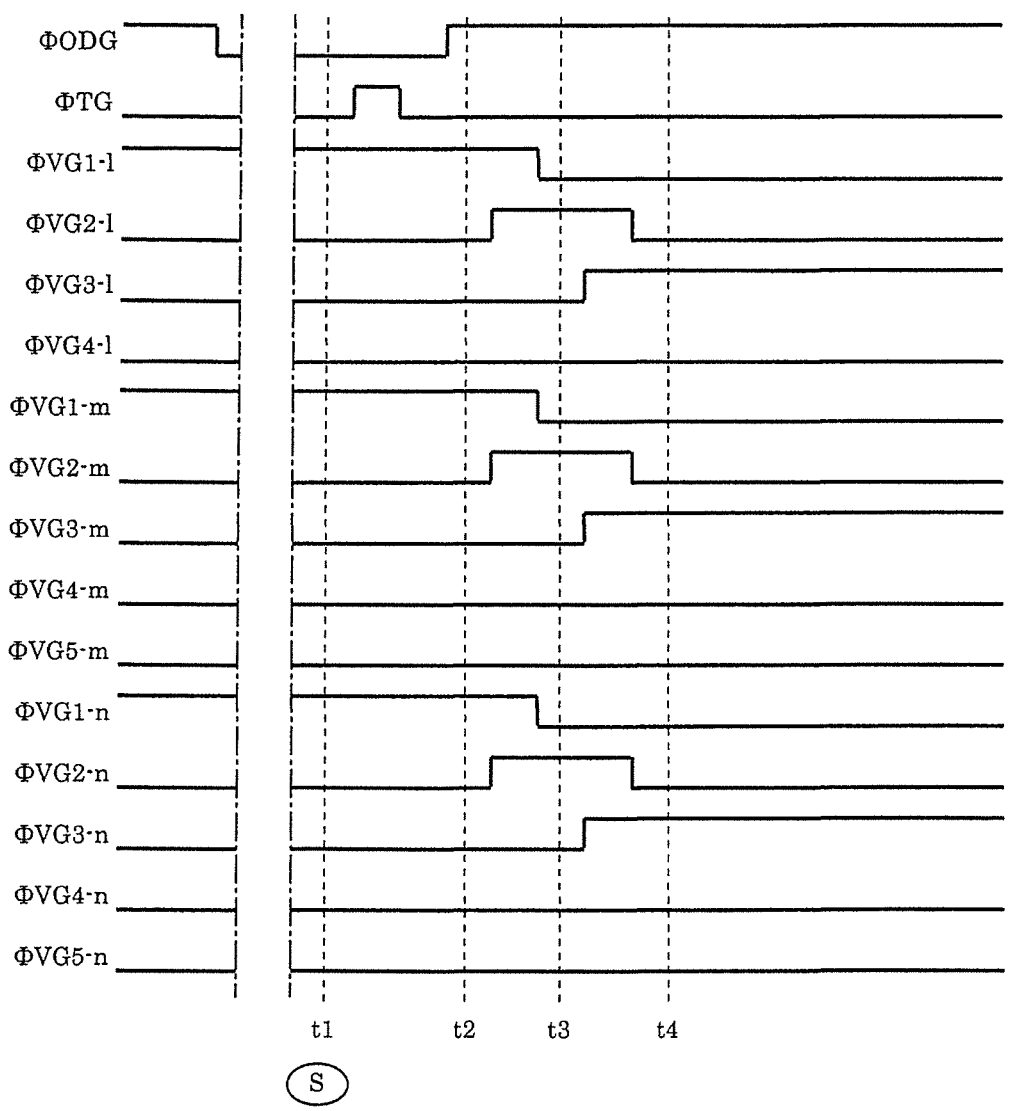
FIG. 5 is a driving timing chart illustrating operations in the exposure period of the solid-state imaging device according to Embodiment 1.

FIG. 4 is a schematic plan view illustrating operations during an exposure period of solid-state imaging device 100 according to Embodiment 1, and FIG. 5 is a driving timing chart illustrating operations during the exposure period of solid-state imaging device 100 according to Embodiment 1.

Operations of solid-state imaging device 100 during the exposure period will be described next with reference to FIGS. 4 and 5.

Drive pulse ΦDG is applied to each of exposure control electrodes 6; drive pulse ΦTG, to each readout electrode 2; and drive pulses ΦVG1-$l$ to ΦVG5-$n$, to each of first transfer electrodes 3. As illustrated in FIG. 5, in the exposure period, drive pulse ΦVG1-$l$, drive pulse OVG1-$m$, and drive pulse ΦVG1-$n$ are signals that change at the same phase, and are substantially identical signals.

These drive pulses are output from timing generator 103.

As an initial state, drive pulse ΦODG applied to exposure control electrode 6 is in a high state, and photoelectric converter 1 is in a reset state. Additionally, ΦTG applied to readout electrode 2 is in a low state, and first transfer electrodes 3a held at a high state (VG1-$l$, VG1-$m$, and VG1-$n$ in FIG. 2) and photoelectric converter 1 are electrically disconnected. In this state, the signal charge generated by photoelectric converter 1 is emitted to charge emitter 7 via exposure control electrode 6, and is not accumulated in photoelectric converter 1.

Next, at time t1, exposure control electrode 6 goes to a low state, the emission of the charge from photoelectric converter 1 to charge emitter 7 is stopped, and photoelectric converter 1 enters a state of accumulating the generated signal charge.

Then, at time t2, when readout electrode 2 goes to a high state for a set period and then returns to a low state, the readout of signal charge S from photoelectric converter 1 to first transfer electrodes 3a (VG1-l, VG1-m, and VG1-n in FIG. 2), simultaneously for all pixels 13 in image capturing unit 101, ends, and exposure control electrode 6 returns to the high state.

Next, by applying the five-phase drive pulse to first transfer electrodes 3, all pixels 13 in image capturing unit 101 simultaneously transfer signal charge S under first transfer electrodes 3b VG2-m, and VG2-n in FIG. 2) (t3). Furthermore, by applying the five-phase drive pulse to first transfer electrodes 3, all pixels 13 in image capturing unit 101 simultaneously transfer signal charge S under first transfer electrodes 3c (VG3-l, VG3-m, and VG3-n in FIG. 2) (t4).

In this manner, in the exposure period within a single frame period, potentials of each of the corresponding first transfer electrodes 3 change in the same manner for all of the plurality of pixels 13.

Figure 6:
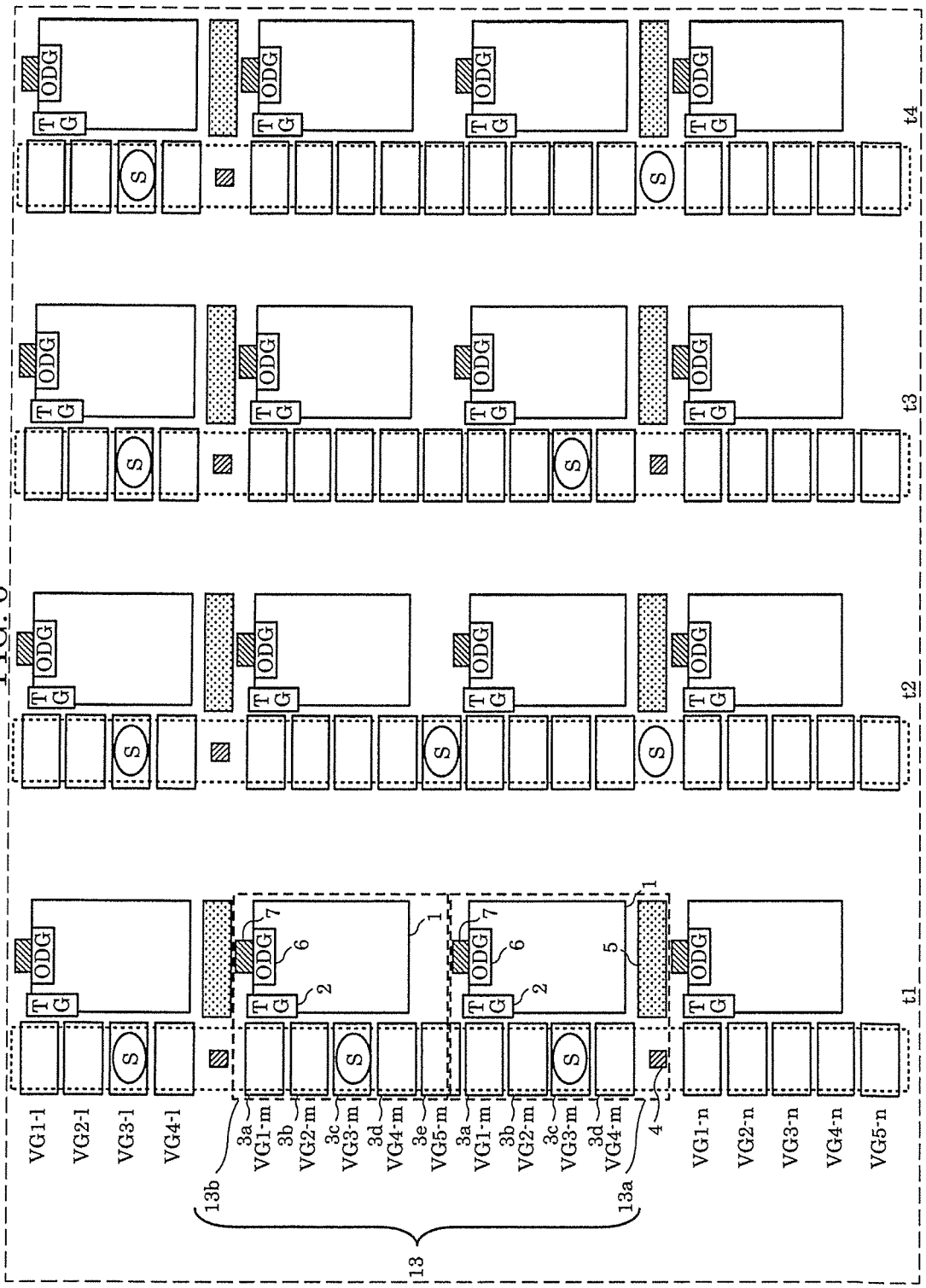
FIG. 6 is a schematic plan view illustrating operations in a transfer period of the solid-state imaging device according to Embodiment 1.
Figure 7:
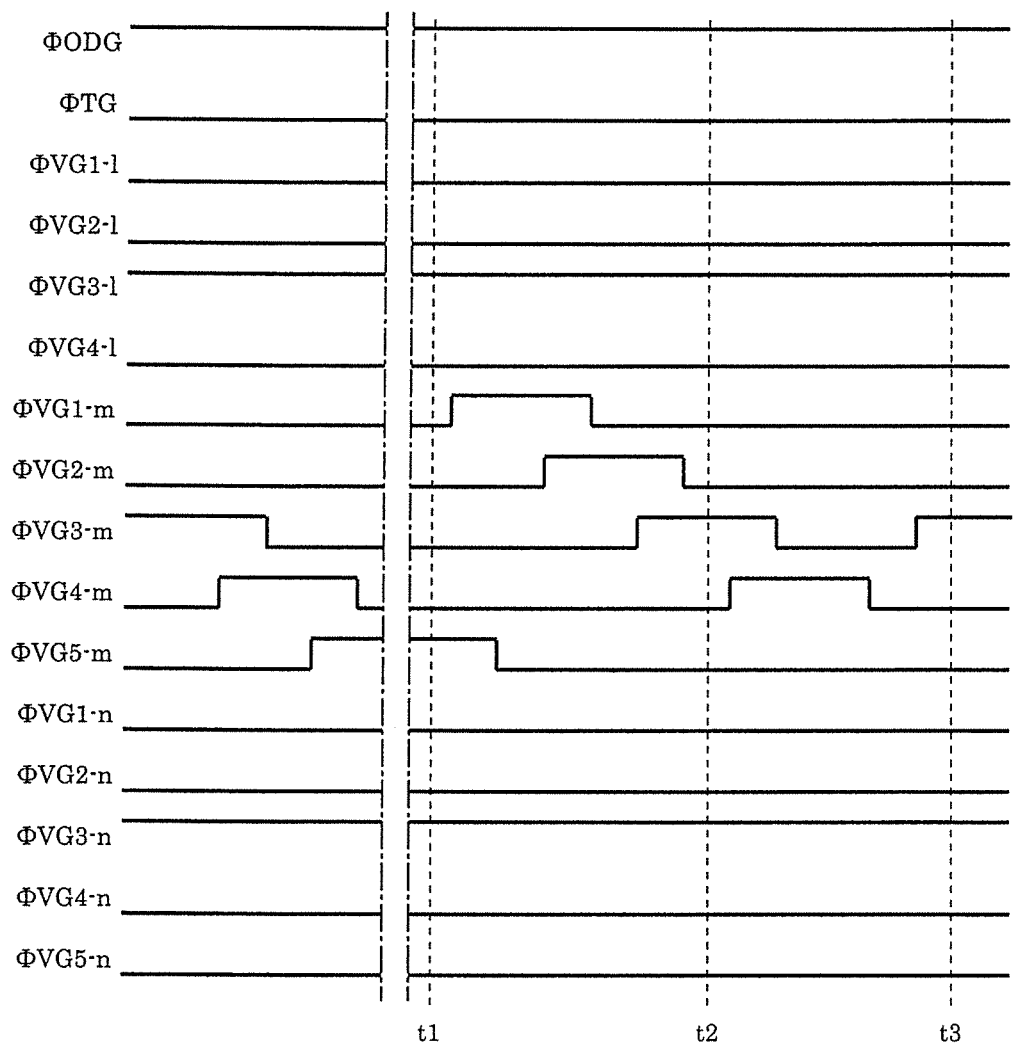
FIG. 7 is a driving timing chart illustrating operations in the transfer period of the solid-state imaging device according to Embodiment 1.

FIG. 6 is a schematic plan view illustrating operations during a transfer period of solid-state imaging device 100 according to Embodiment 1, and FIG. 7 is a driving timing chart illustrating operations during the transfer period of solid-state imaging device 100 according to Embodiment 1.

Operations of solid-state imaging device 100 during the transfer period will be described next with reference to FIGS. 6 and 7.

Focusing on row m (the second row from the top and the third row from the top in FIG. 6), at initial time t1, first transfer electrodes 3c (VG3-m in FIG. 2) are in the high state, and signal charge S is accumulated under the electrodes.

Next, by applying the five-phase drive pulse to first transfer electrodes 3c to 3e in row m (VG3-m, VG4-m, and VG5-m in FIG. 2), signal charge S in row m is transferred to first transfer electrodes 3e (VG5-m in FIG. 2) and floating diffusion layer 4 (t2). Although not illustrated here, signal charge S transferred to floating diffusion layer 4 is read out via readout circuit 5.

Next, by applying the five-phase drive pulse to first transfer electrodes 3e and 3a to 3c in row m (VG5-m, VG1-m, VG2-m, and VG3-m in FIG. 2), signal charge S in row m is transferred to first transfer electrodes 3c (VG3-m in FIG. 2) (t3). Furthermore, by applying the five-phase drive pulse to first transfer electrodes 3c and 3d in row m (VG3-m and VG4-m in FIG. 2), signal charge S in row m is transferred to floating diffusion layer 4 and is read out via readout circuit 5 (t4).

Here, unlike the exposure period, in the transfer period, during the period in which pixels 13 in row m operate (the second row from the top and the third row from the top in FIG. 6), only pixels 13 in row m operate, and the operations of the other pixels 13 are stopped. In other words, first pixels 13a are arranged in rows in which a plurality of floating diffusion layers are disposed (here, the first row from the top and the third row from the top in FIG. 2). In the transfer period within a single frame period, potentials of the plurality of first transfer electrodes 3 which correspond to each other in pixel group units, the units constituted by first pixels 13a disposed in a row in which a plurality of floating diffusion layers are disposed (here, the third row from the top in FIG. 2) and pixels 13 sharing floating diffusion layer 4 included in those first pixels 13a, change in the same manner. During a period in which the potentials of first transfer electrodes 3 are changing in one pixel group, the potentials of first transfer electrodes 3 in other pixel groups do not change.

According to solid-state imaging device 100 of Embodiment 1 as described thus far, causing first transfer electrodes 3 of a plurality of pixels 13 to operate at the same timings makes it possible to connect those pixels 13 with the same control lines 12, and the number of control lines used for a single pixel 13 can therefore be reduced. The area of the openings that take in light can therefore be increased, which makes it possible to provide a solid-state imaging device having excellent sensitivity characteristics.

In Embodiment 1, signal charges read out from a plurality of (e.g., two) photoelectric converters 1 are read out from a single floating diffusion layer 4 and readout circuit 5. However, it is possible to provide a solid-state imaging device that reduces the number of control lines used for a single pixel 13 even more, and that therefore has even better sensitivity characteristics, by reading out signal charges read out from more, e.g., four photoelectric converters 1 via a single floating diffusion layer 4 and readout circuit 5.

Embodiment 2

A solid-state imaging device according to Embodiment 2 of the present disclosure will be described next, focusing on the differences from Embodiment 1.

Figure 8:
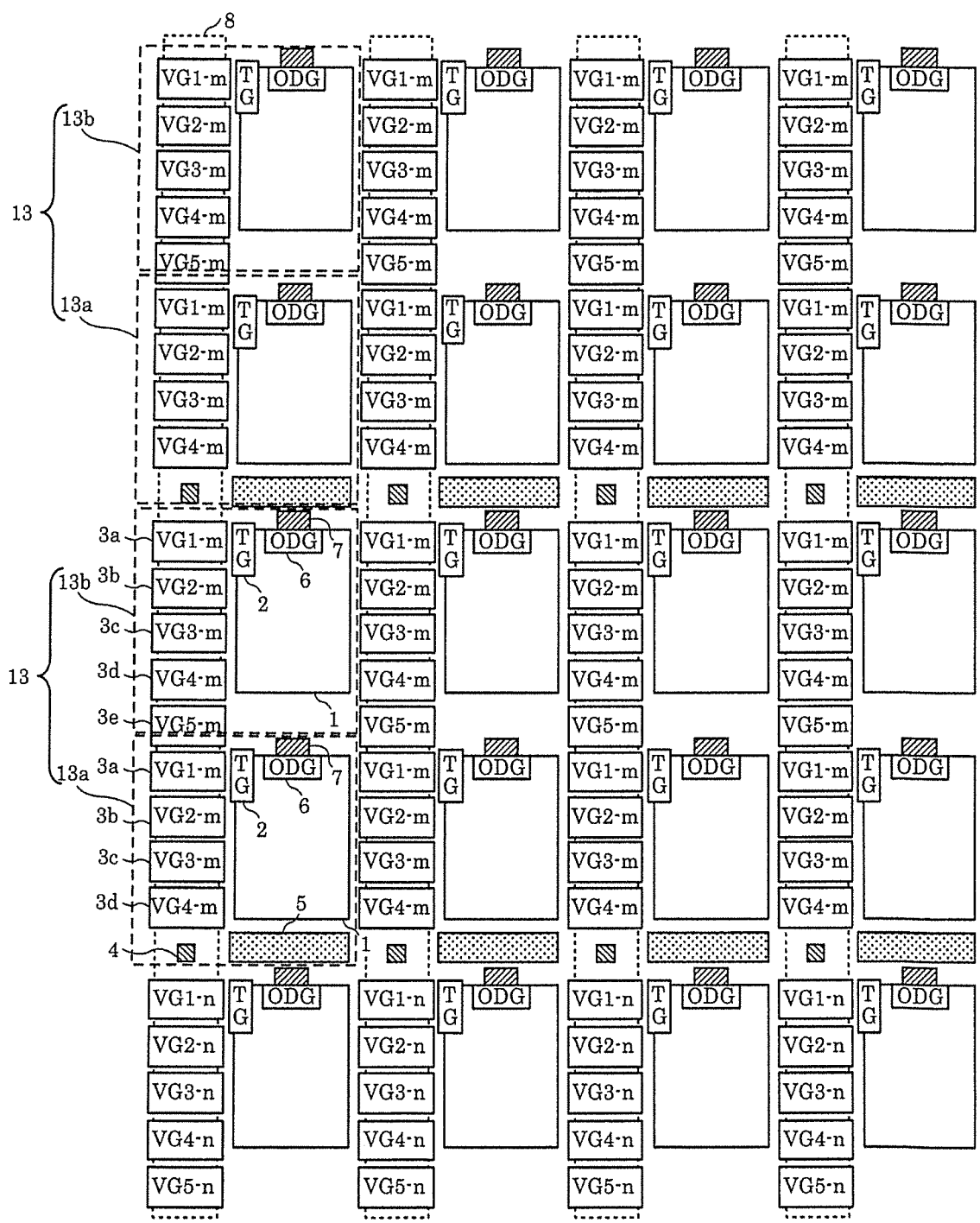
FIG. 8 is a schematic plan view illustrating a layout of pixels included in a solid-state imaging device according to Embodiment 2.

FIG. 8 is a schematic plan view illustrating a layout of pixels 13 included in the solid-state imaging device according to Embodiment 2.

In the solid-state imaging device according to Embodiment 2, the configuration of control lines 12 (not shown in FIG. 8) connected to first transfer electrodes 3 is different from that in Embodiment 1. Specifically, VG1-l to VG5-l, which are first transfer electrodes 3, are replaced with VG1-m to VG5-m, which are first transfer electrodes 3, and the readout operations in the transfer period are different as a result. Here, first transfer electrodes 3 given the same reference sign (e.g., VG1-m, VG2-m, VG3-m, VG4-m, and so on) are connected to the same control line 12.

As a result, the number of control lines can be reduced by more than in Embodiment 1; furthermore, because readout circuits 5 in two rows operate simultaneously, the transfer period within a single frame can be shortened. Note that in this case, for example, AD converter 102 requires two sets of circuits that execute readout operations using readout circuit 5 of one row and that operate independent of each other, so that the signal charges can be read out using readout circuits 5 from two rows simultaneously.

Figure 9:
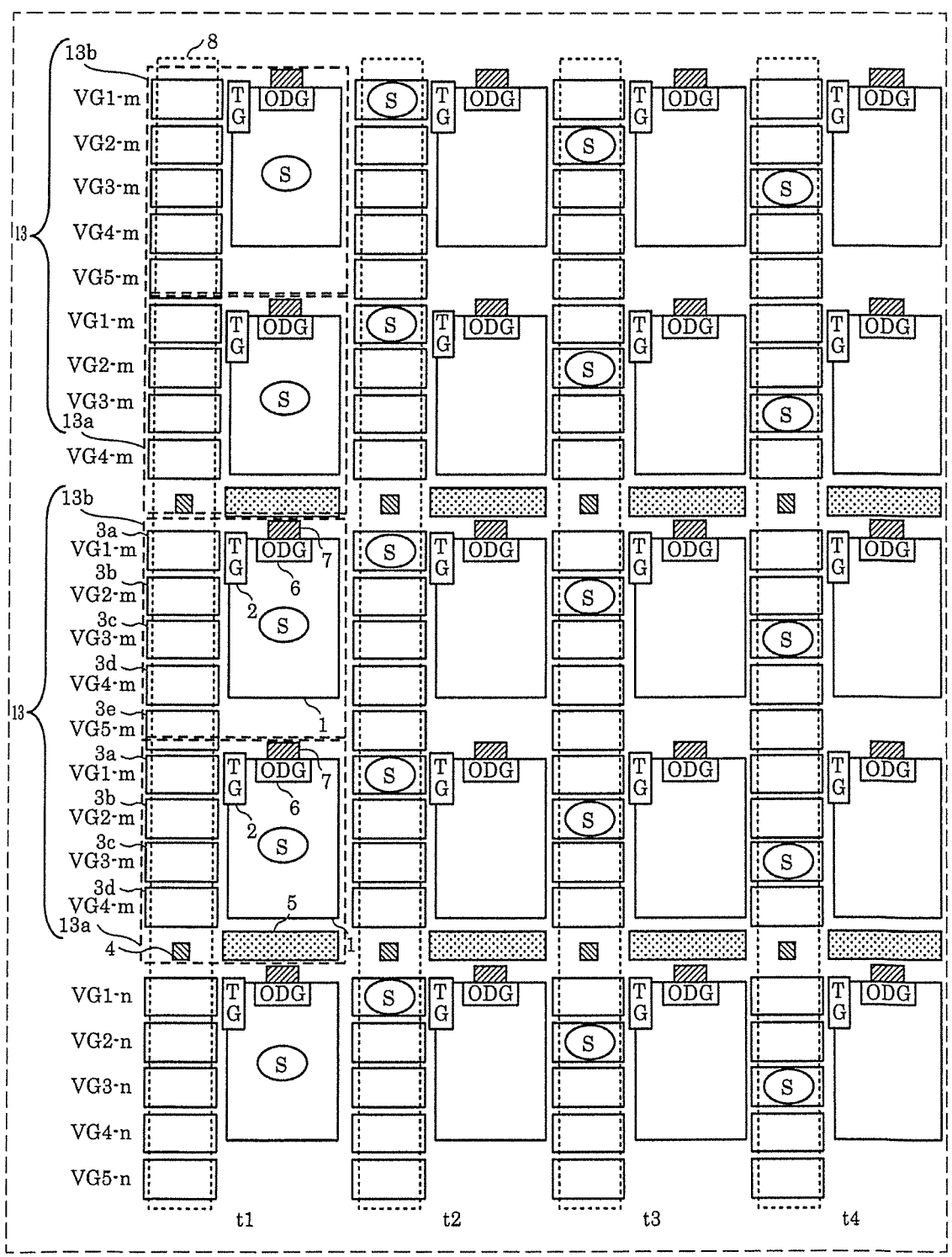
FIG. 9 is a schematic plan view illustrating operations in an exposure period of the solid-state imaging device according to Embodiment 2.

FIG. 9 is a schematic plan view illustrating operations during an exposure period of the solid-state imaging device according to Embodiment 2, and a driving timing chart illustrating the operations in the exposure period is the same as that illustrated in FIG. 5.

The exposure period operations of the solid-state imaging device according to Embodiment 2 illustrated in FIG. 9 differ from Embodiment 1 only in that VG1-l to VG5-l, which are first transfer electrodes 3, have been replaced with VG1-m to VG5-m, which are first transfer electrodes 3, and the operations themselves are the same.

Figure 10:
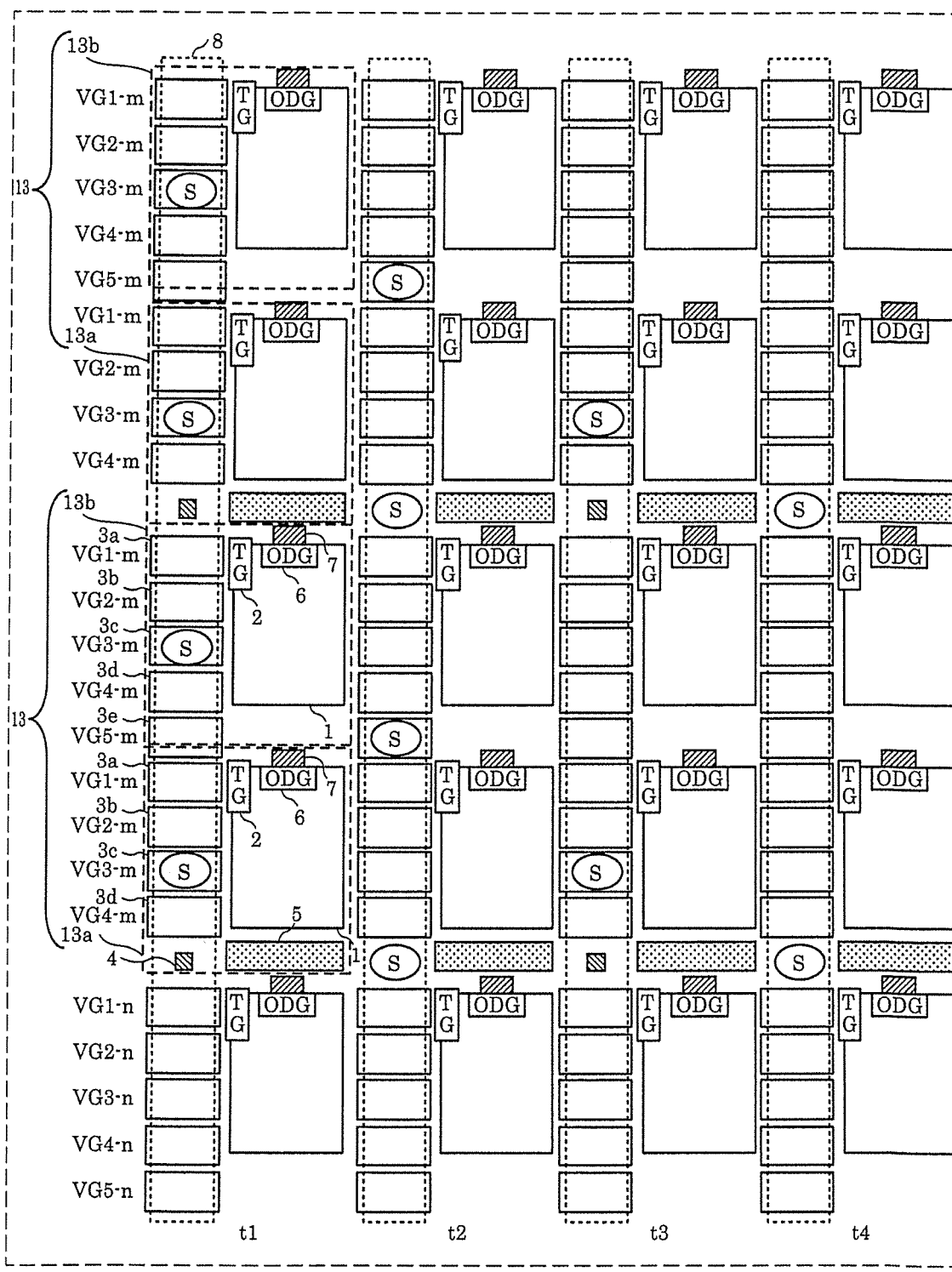
FIG. 10 is a schematic plan view illustrating operations in a transfer period of the solid-state imaging device according to Embodiment 2.

FIG. 10 is a schematic plan view illustrating operations during a transfer period of the solid-state imaging device according to Embodiment 2, and a driving timing chart illustrating the operations in the transfer period is the same as that illustrated in FIG. 7.

Operations of the solid-state imaging device according to Embodiment 2 during the transfer period will be described next with reference to FIGS. 10 and 7.

At times t1 and t3, solid-state imaging device 100 according to Embodiment 1 reads out signal charge S via floating diffusion layer 4 and readout circuit 5 disposed in one row. However, the solid-state imaging device according to Embodiment 2 reads out signal charge S via floating diffusion layers 4 and readout circuits 5 disposed in two rows simultaneously.

According to the solid-state imaging device of Embodiment 2 as described thus far, the number of first transfer electrodes 3 and readout circuits 5 operating simultaneously in the transfer period can be increased. As a result, compared to solid-state imaging device 100 according to Embodiment 1, the solid-state imaging device according to Embodiment 2 can reduce the number of control lines per pixel 13, and can also shorten the transfer period within a single frame. This makes it possible to improve the sensitivity characteristics and increase the framerate.

Embodiment 3

A solid-state imaging device according to Embodiment 3 of the present disclosure will be described next, focusing on the differences from Embodiment 1.

Figure 11:
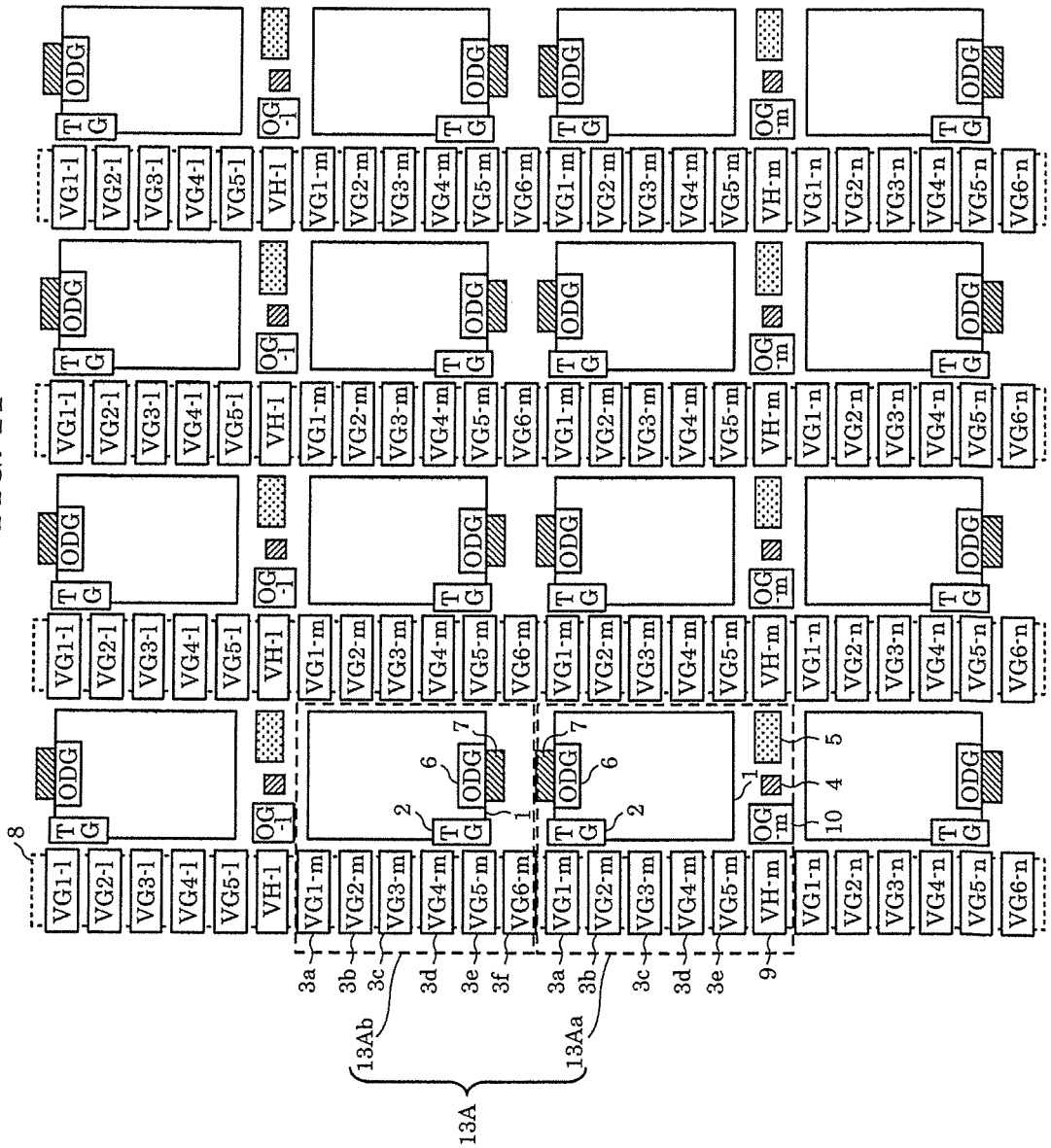
FIG. 11 is a schematic plan view illustrating a layout of pixels included in a solid-state imaging device according to Embodiment 3.

FIG. 11 is a schematic plan view illustrating a layout of pixels 13A included in a solid-state imaging device according to Embodiment 3. Compared to Embodiment 1, in the solid-state imaging device according to Embodiment 3, first pixels 13a according to Embodiment 1 are changed to first pixels 13Aa, and second pixels 13b according to Embodiment 1 are changed to second pixels 13Ab.

First pixel 13Aa is configured by adding first transfer electrode 3e, second transfer electrode 9, and output control electrode 10 to first pixel 13a according to Embodiment 1.

Second transfer electrode 9 is disposed adjacent to one of first transfer electrodes 3 (first transfer electrode 3e, here) in the column direction of the plurality of pixels 13A disposed in matrix form, i.e., in the up-down direction in FIG. 11, and transfers signal charges in the column direction and the row direction.

Output control electrode 10 is disposed adjacent to second transfer electrode 9 in the row direction of the plurality of pixels 13A disposed in matrix form, i.e., in the left-right direction in FIG. 11, and transfers signal charges in the row direction.

Additionally, in first pixel 13Aa, floating diffusion layer 4 is disposed adjacent to output control electrode 10 in the row direction.

Second pixel 13Ab is configured by adding first transfer electrode 3f to second pixel 13b according to Embodiment 1.

Like second pixel 13b according to Embodiment 1, second pixel 13Ab shares floating diffusion layer 4 with one of first pixels 13Aa arranged in the column direction.

Additionally, with second pixel 13Ab, the positions of readout electrode 2, exposure control electrode 6, and charge emitter 7 relative to photoelectric converter 1 have been changed to be symmetrical with respect to the column direction, as opposed to second pixel 13b in Embodiment 1.

As a result, first pixels 13Aa, each including readout electrode 2 above photoelectric converter 1 in the vertical direction, and second pixels 13Ab, each including readout electrode 2 below photoelectric converter 1 in the vertical direction, are disposed alternately from row to row. The signal charges read out from the two photoelectric converters 1 adjacent in the vertical direction are thus added below first transfer electrodes 3, and the sensitivity characteristics of the solid-state imaging device can be improved as a result.

In other words, in two or more pixels 13A sharing at least one floating diffusion layer 4 arranged in the column direction (here, first pixel 13Aa and second pixel 13Ab), the signal charges read out from photoelectric converters 1 are added under at least one of the plurality of first transfer electrodes 3 included in the two or more pixels 13A (here, first transfer electrode 3e of second pixel 13Ab, first transfer electrode 3f of second pixel 13Ab, and first transfer electrode 3a of first pixel 13Aa). The specific operations will be described later with reference to FIG. 13.

Additionally, a charge accumulator is formed by first transfer electrodes 3 and second transfer electrode 9 to which a high voltage is applied and transfer channel 8 provided under those electrodes. Here, the descriptions will be given assuming that each charge accumulator is driven in six phases as an example. As such, four types of signal charges can be accumulated in units of two pixels, and thus the solid-state imaging device according to Embodiment 3 can be used in a rangefinding camera.

In FIG. 11, first transfer electrodes 3 given the same reference sign (e.g., VG1-$m$, VG2-$m$, VG3-$m$, VG4-$m$, and so on) are connected to the same control line.

Figure 12:
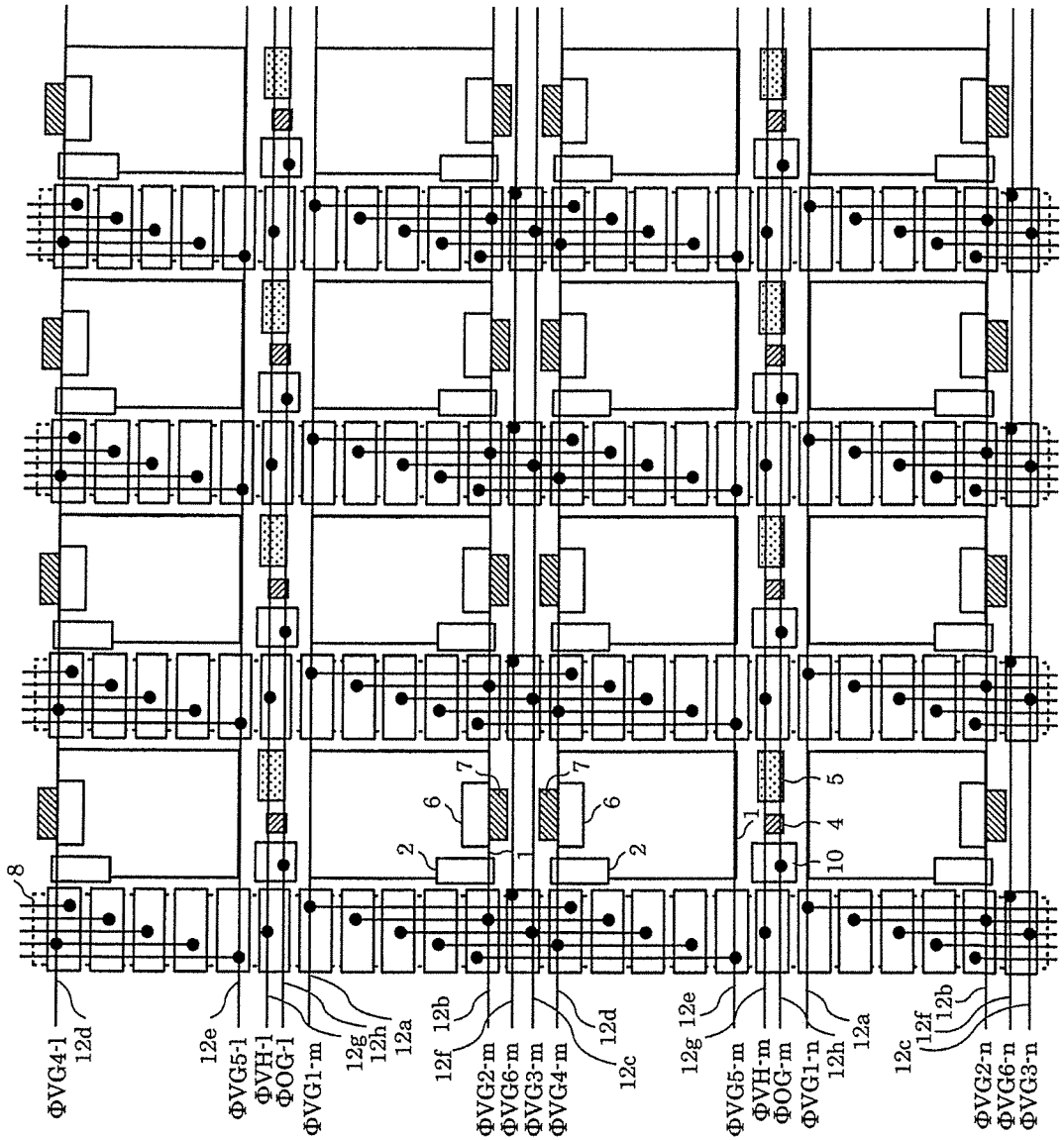
FIG. 12 is a schematic plan view illustrating a layout of control lines included in the solid-state imaging device according to Embodiment 3.

FIG. 12 is a schematic plan view illustrating a layout of control lines 12 connected to first transfer electrodes 3, second transfer electrode 9, and output control electrode 10, for pixels 13A included in the solid-state imaging device according to Embodiment 3.

As illustrated in FIG. 12, connecting the plurality of first transfer electrodes 3 provided in a plurality (e.g., two) pixels 13A arranged in the vertical direction reduces the number of control lines 12 provided in the horizontal direction.

Figure 13:
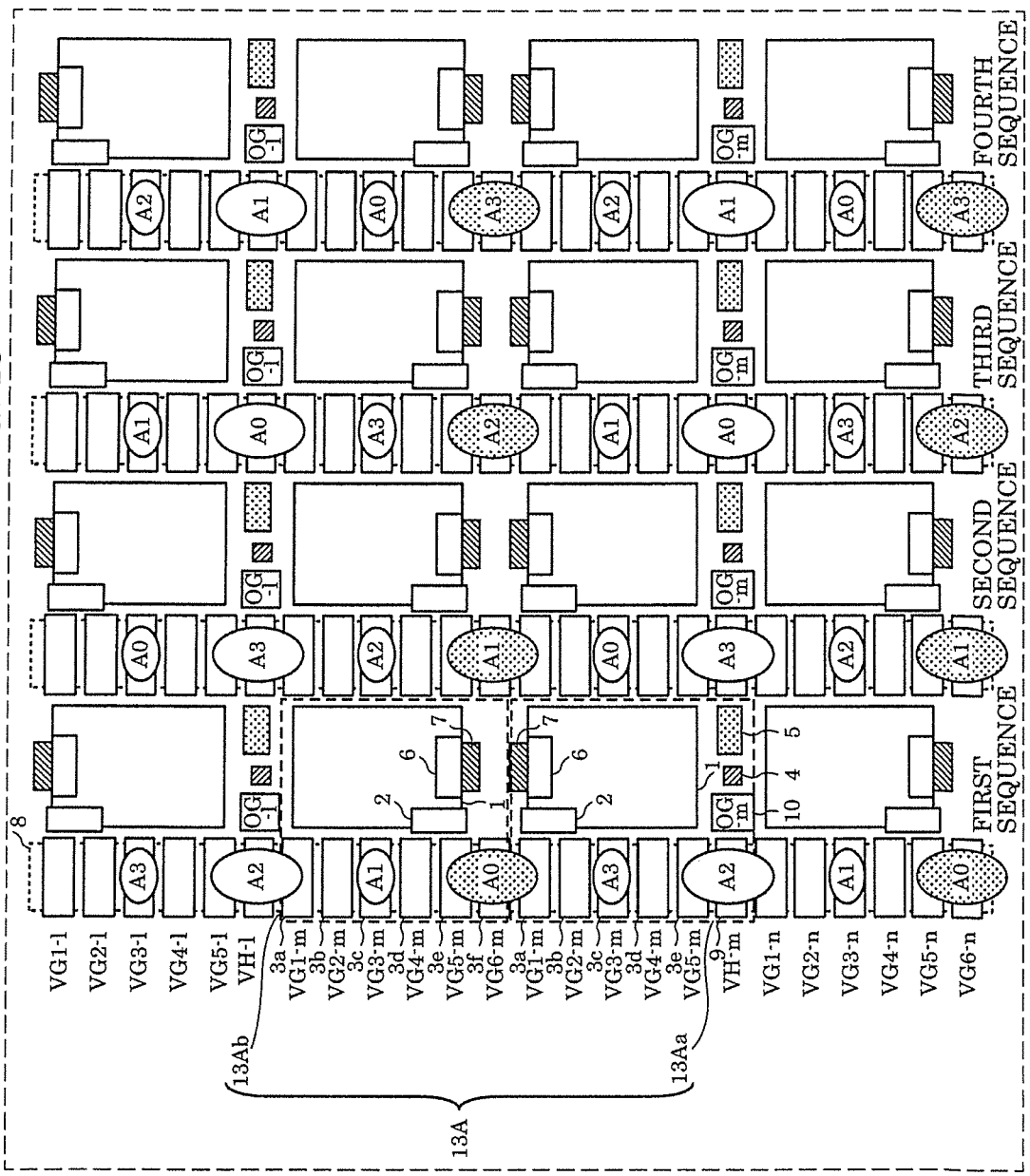
FIG. 13 is a schematic plan view illustrating operations in an exposure period of the solid-state imaging device according to Embodiment 3.

FIG. 13 is a schematic plan view illustrating operations during an exposure period of the solid-state imaging device according to Embodiment 3, and FIGS. 14A to 14D are driving timing charts illustrating operations during the exposure period of the solid-state imaging device according to Embodiment 3.

Operations of the solid-state imaging device according to Embodiment 3 during the exposure period will be described next with reference to FIGS. 13 and 14A to 14D.

Drive pulse ΦODG is applied to each of exposure control electrodes 6; and drive pulse ΦTG, to each readout electrode 2. Although not illustrated in FIGS. 13 and 14A to 14D, during exposure, a high voltage is applied for applied pulse ΦVG1 of first transfer electrode 3a, applied pulse ΦVG3 of first transfer electrode 3c, applied pulse ΦVG5 of first transfer electrode 3e, applied pulse ΦVG6 of first transfer electrode 3f, and applied pulse ΦVH of second transfer electrode 9, and a low voltage is applied for the applied pulse of the other first transfer electrodes 3. The signal charges can be accumulated under first transfer electrodes 3 to which the high voltage has been applied, and a charge accumulator is formed. Additionally, pulsed infrared light that repeatedly turns on and off at a constant cycle is repeatedly emitted from light source 500.

In an initial state, exposure control electrode 6 and readout electrode 2 are in the high state, and the signal charge generated by photoelectric converter 1 is emitted to charge emitter 7 via exposure control electrode 6.

In first to fourth sequences illustrated in FIGS. 14A to 14D, readout electrode 2 is always in the high state, but the timings of the drive pulse ΦODG synchronized with the emitted light are different.

Figure 14:
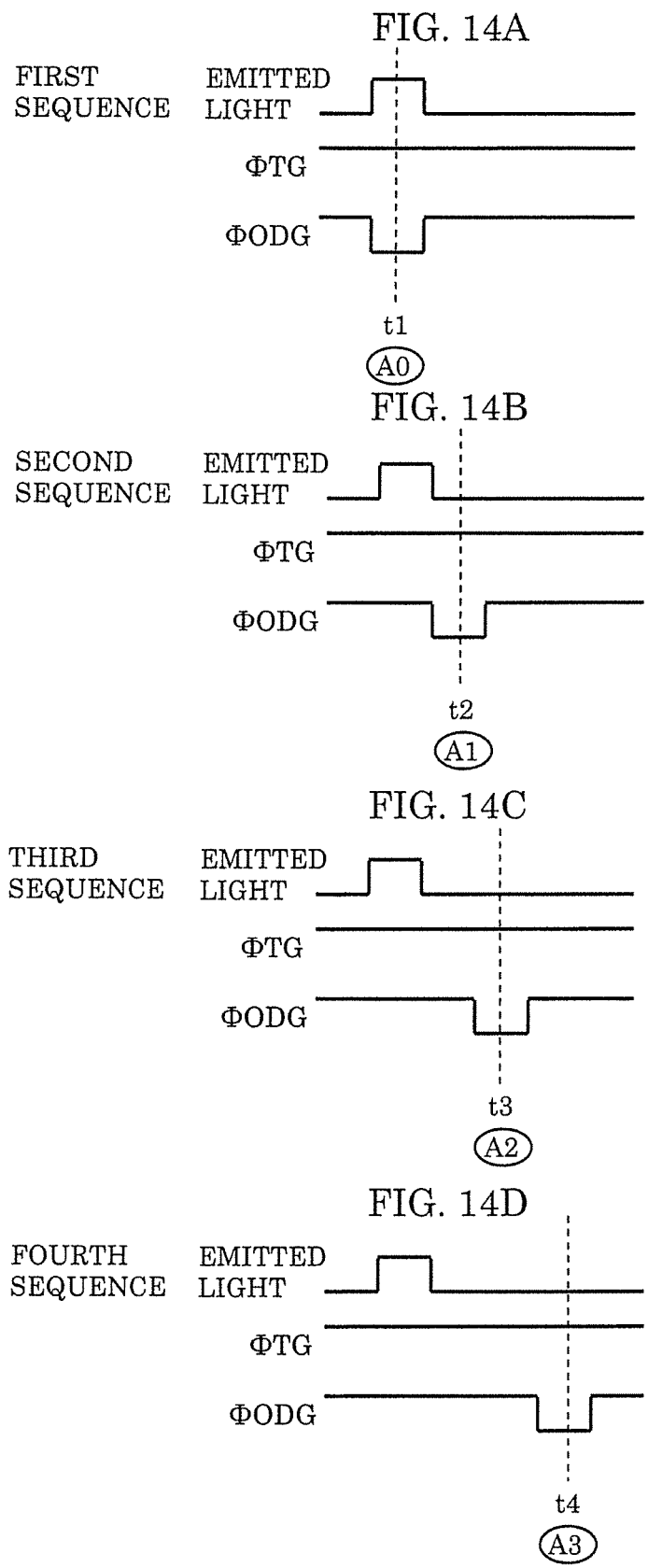
FIG. 14A is a driving timing chart illustrating operations in the exposure period of the solid-state imaging device according to Embodiment 3.
FIG. 14B is a driving timing chart illustrating operations in the exposure period of the solid-state imaging device according to Embodiment 3.
FIG. 14C is a driving timing chart illustrating operations in the exposure period of the solid-state imaging device according to Embodiment 3.
FIG. 14D is a driving timing chart illustrating operations in the exposure period of the solid-state imaging device according to Embodiment 3.

In the first sequence illustrated in FIG. 14A, all pixels 13A in image capturing unit 101 simultaneously accumulate signal charge A0 obtained at time t1, and repeat this accumulation a plurality of times. At this time, signal charge A0 read out from photoelectric converter 1 of first pixel 13Aa and signal charge A0 read out from photoelectric converter 1 of second pixel 13Ab are added under first transfer electrode 3e of second pixel 13Ab (VG5-m), first transfer electrode 3f of second pixel 13Ab (VG6-m), and first transfer electrode 3a of first pixel 13Aa (VG1-m), as indicated by the part of FIG. 13 corresponding to the first sequence.

Although not illustrated, a six-phase drive pulse is applied to first transfer electrodes 3, and the signal charges are transferred downward in the column direction, for all pixels 13A in image capturing unit 101 simultaneously when transitioning from the first sequence to the second sequence.

In the second sequence illustrated in FIG. 14B, all pixels 13A in image capturing unit 101 simultaneously accumulate signal charge A1 obtained at time t2, and repeat this accumulation a plurality of times. At this time, signal charge A1 read out from photoelectric converter 1 of first pixel 13Aa and signal charge A1 read out from photoelectric converter 1 of second pixel 13Ab are added under first transfer electrode 3e of second pixel 13Ab (VG5-m), first transfer electrode 3f of second pixel 13Ab (VG6-m), and first transfer electrode 3a of first pixel 13Aa (VG1-m), as indicated by the part of FIG. 13 corresponding to the second sequence.

Although not illustrated, a six-phase drive pulse is applied to first transfer electrodes 3, and the signal charges are transferred downward in the column direction, for all pixels 13A in image capturing unit 101 simultaneously when transitioning from the second sequence to the third sequence.

In the third sequence illustrated in FIG. 14C, all pixels 13A in image capturing unit 101 simultaneously accumulate signal charge A2 obtained at time t3, and repeat this accumulation a plurality of times. At this time, signal charge A2 read out from photoelectric converter 1 of first pixel 13Aa and signal charge A2 read out from photoelectric converter 1 of second pixel 13Ab are added under first transfer electrode 3e of second pixel 13Ab (VG5-m), first transfer electrode 3f of second pixel 13Ab (VG6-m), and first transfer electrode 3a of first pixel 13Aa (VG1-m), as indicated by the part of FIG. 13 corresponding to the third sequence.

Although not illustrated, a six-phase drive pulse is applied to first transfer electrodes 3, and the signal charges are transferred downward in the column direction, for all pixels 13A in image capturing unit 101 simultaneously when transitioning from the third sequence to the fourth sequence.

In the fourth sequence illustrated in FIG. 14D, all pixels 13A in image capturing unit 101 simultaneously accumulate signal charge A3 obtained at time t4, and repeat this accumulation a plurality of times. At this time, signal charge A3 read out from photoelectric converter 1 of first pixel 13Aa and signal charge A3 read out from photoelectric converter 1 of second pixel 13Ab are added under first transfer electrode 3e of second pixel 13Ab (VG5-m), first transfer electrode 3f of second pixel 13Ab (VG6-m), and first transfer electrode 3a of first pixel 13Aa (VG1-m), as indicated by the part of FIG. 13 corresponding to the fourth sequence.

Although not illustrated, a six-phase drive pulse is applied to first transfer electrodes 3, and the signal charges are transferred upward in the column direction, for all pixels 13A in image capturing unit 101 simultaneously when transitioning from the fourth sequence to the first sequence.

In the exposure period, each of the first to fourth sequences repeated a plurality of times is taken as a single set, and the set is repeated a plurality of times.

In this manner, in the exposure period within a single frame period, potentials of each of the corresponding first transfer electrodes 3 change in the same manner for all of the plurality of pixels 13A.

Figure 15:
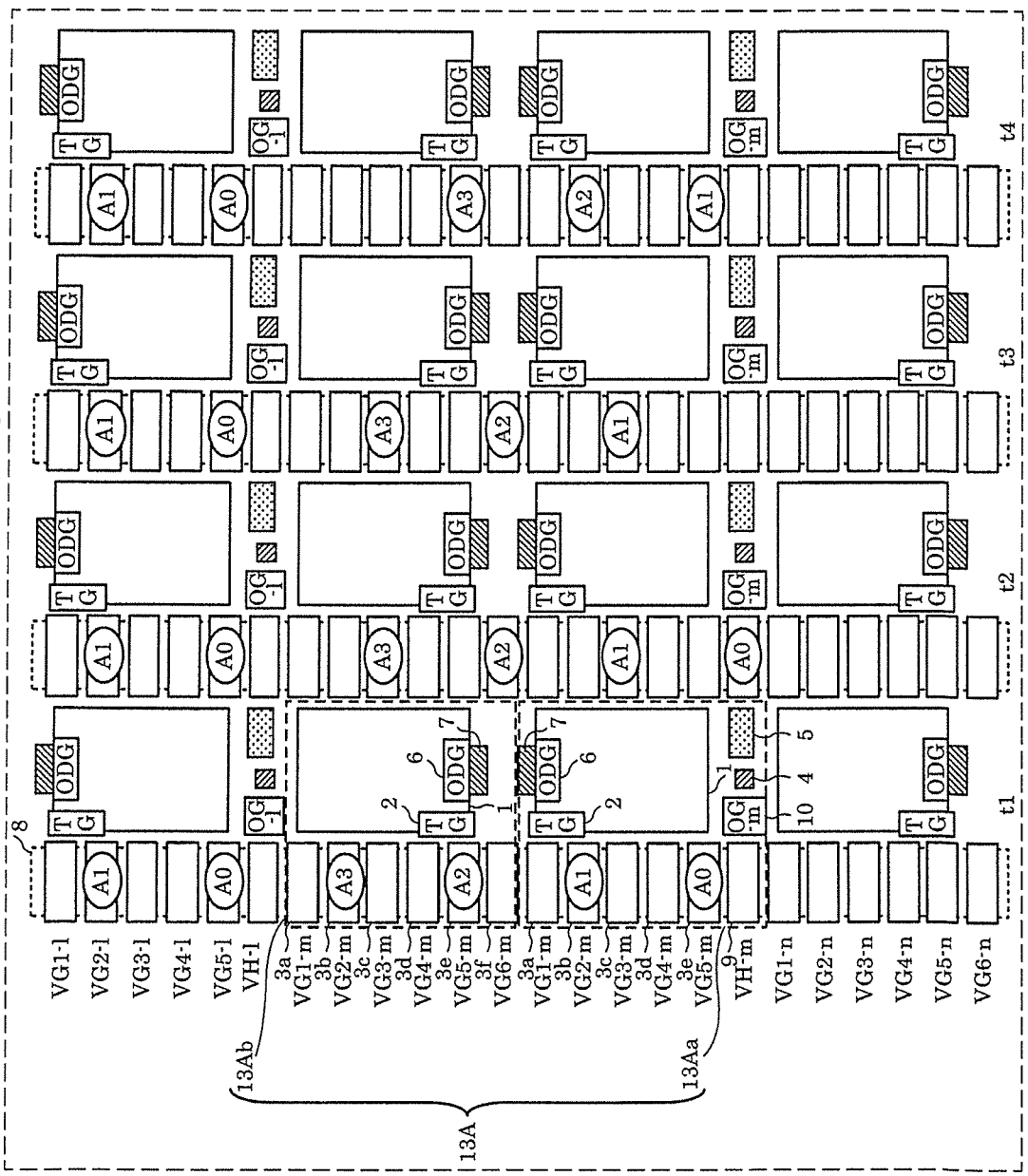
FIG. 15 is a schematic plan view illustrating operations in a transfer period of the solid-state imaging device according to Embodiment 3.
Figure 16:
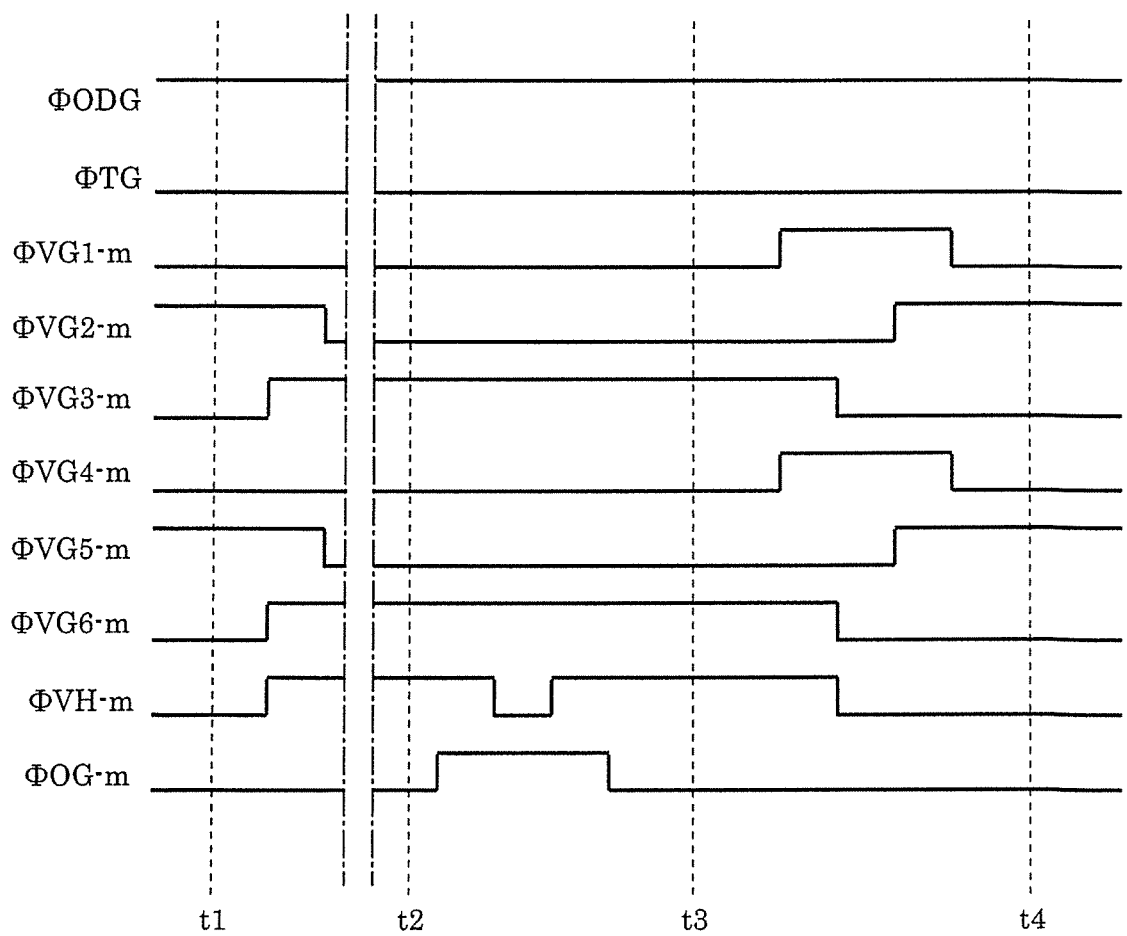
FIG. 16 is a driving timing chart illustrating operations in the transfer period of the solid-state imaging device according to Embodiment 3.

FIG. 15 is a schematic plan view illustrating operations during the transfer period of the solid-state imaging device according to Embodiment 3, and FIG. 16 is a driving timing chart illustrating operations during the transfer period of the solid-state imaging device according to Embodiment 3.

Operations during the transfer period will be described next with reference to FIGS. 15 and 16.

Focusing on row m (the second row from the top and the third row from the top in FIG. 15), at initial time t1, first transfer electrodes 3b (VG2-m in FIG. 11) and first transfer electrodes 3e (VG5-m in FIG. 11) are in the high state, and signal charges A0 to A3 are accumulated under first transfer electrodes 3b and first transfer electrodes 3e.

Next, signal charges A0 to A3 are transferred downward in the column direction (t2) in response to a six-phase drive pulse being applied to first transfer electrodes 3a to 3f and second transfer electrode 9 in row m (VG1-m to VG6-m and VH-m in FIG. 11).

Next, signal charge A0 is transferred to floating diffusion layer 4 (t3) in response to drive pulses being applied to second transfer electrode 9 (VH-m in FIG. 11) and output control electrode 10 (OG-m in FIG. 11) in row m. Although not illustrated here, signal charge A0 transferred to floating diffusion layer 4 is read out via readout circuit 5.

Next, signal charges A1 to A3 are transferred downward in the column direction (t4) in response to a six-phase drive pulse being applied to first transfer electrodes 3a to 3f and second transfer electrode 9 in row m (VG1-m to VG6-m and VH-m in FIG. 11).

Next, although not illustrated, signal charges A1, A2, and A3 are read out in the same manner as signal charge A0 by repeating the operations from t1 to t4, and the distance to the subject is calculated using signal charges A0 to A3.

Here, unlike the exposure period, in the transfer period, during the period in which pixels 13A in row m operate (the second row from the top and the third row from the top in FIG. 15), only pixels 13A in row m operate, and the operations of the other pixels 13A are stopped.

According to the solid-state imaging device of Embodiment 3 as described thus far, by adding the signal charges read out from two photoelectric converters 1 adjacent in the vertical direction under first transfer electrodes 3, the sensitivity characteristics of the solid-state imaging device can be improved more than with solid-state imaging device 100 according to Embodiment 1. Furthermore, multi-phase driving (e.g., six-phase driving) can be carried out by first transfer electrodes 3 having added the signal charges, and a plurality of types (e.g., four types) of signal charges can be accumulated in a plurality of (e.g., two) pixels 13A. As such, the solid-state imaging device according to Embodiment 3 can be used in a rangefinding camera.

Embodiment 4

A solid-state imaging device according to Embodiment 4 of the present disclosure will be described next, focusing on the differences from Embodiment 3.

Figure 17:
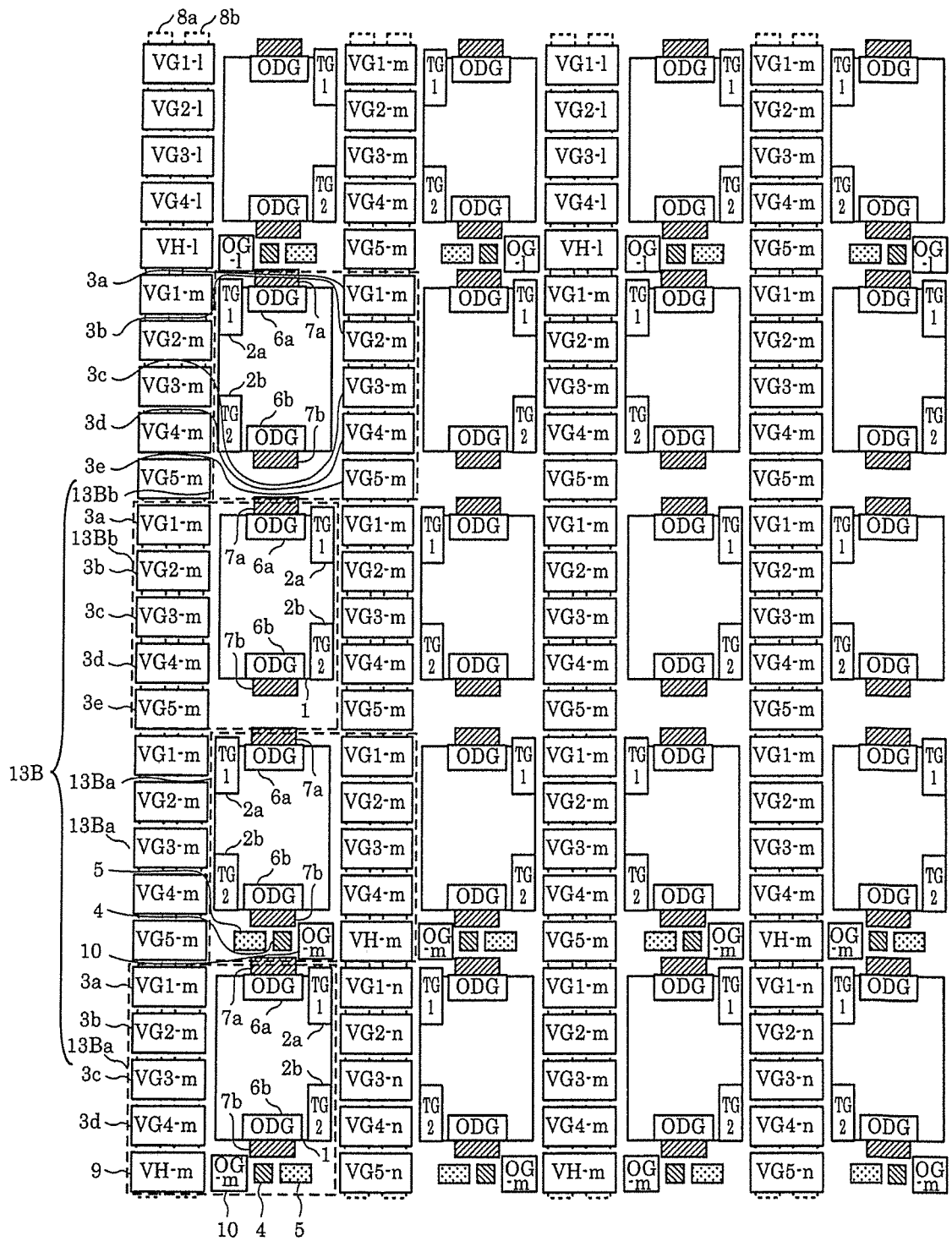
FIG. 17 is a schematic plan view illustrating a layout of pixels included in a solid-state imaging device according to Embodiment 4.

FIG. 17 is a schematic plan view illustrating a layout of pixels 13B included in a solid-state imaging device according to Embodiment 4. Compared to Embodiment 3, in the solid-state imaging device according to Embodiment 4, first pixels 13Aa according to Embodiment 3 are changed to first pixels 13Ba, and second pixels 13Ab according to Embodiment 3 are changed to second pixels 13Bb.

First pixel 13Ba is configured by removing first transfer electrode 3e from first pixel 13Aa according to Embodiment 3. Furthermore, whereas first pixel 13Aa according to Embodiment 3 includes a single transfer channel 8, first pixel 13Ba includes two transfer channels 8, namely transfer channel 8a and transfer channel 8b. In other words, first pixel 13Ba includes k (where k is an integer greater than or equal to two; two is used here) transfer channels (here, transfer channels 8a and 8b), so that the k (here, two) transfer channels 8 (here, transfer channels 8a and 8b) running under respective ones of a plurality of first transfer electrodes 3 and accumulating signal charges are disposed side-by-side in the row direction of the matrix in which the plurality of pixels 13B are disposed.

As illustrated in FIG. 17, first pixels 13Ba are disposed so as to be flipped on a column-by-column and a row-by-row basis in the matrix in which the plurality of pixels 13B are disposed. As a result, (1) second transfer electrodes 9 of first pixels 13Ba adjacent in the row direction transfer signal charges in the row direction in mutually-opposite directions with respect to the row direction; (2) the order in which output control electrode 10, floating diffusion layer 4, and readout circuit 5 included in each first pixel 13Ba are disposed with respect to the row direction is flipped on a column-by-column and row-by-row basis; and (3) output control electrodes 10 at identical potentials are disposed adjacent to both ends of second transfer electrode 9 with respect to the row direction.

Additionally, although first pixel 13Aa according to Embodiment 3 includes one readout electrode 2, one exposure control electrode 6, and one charge emitter 7 for a single photoelectric converter 1, first pixel 13Ba includes two readout electrodes 2, namely readout electrode 2a and readout electrode 2b, two exposure control electrodes 6, namely exposure control electrode 6a and exposure control electrode 6b, and two charge emitters 7, namely charge emitter 7a and charge emitter 7b, for a single photoelectric converter 1. Here, with respect to photoelectric converter 1, a positional relationship between readout electrode 2a and readout electrode 2b, a positional relationship between exposure control electrode 6a and exposure control electrode 6b, and a positional relationship between charge emitter 7a and charge emitter 7b, are symmetrical with respect to the column direction.

Second pixel 13Bb is configured by removing first transfer electrode 3f from second pixel 13Ab according to Embodiment 3. Furthermore, whereas second pixel 13Ab according to Embodiment 3 includes a single transfer channel 8, second pixel 13Bb includes two transfer channels 8, namely transfer channel 8a and transfer channel 8b. In other words, second pixel 13Bb includes k (where k is an integer greater than or equal to two; two is used here) transfer channels (here, transfer channels 8a and 8b), so that the k (here, two) transfer channels (here, transfer channels 8a and 8b) running under respective ones of a plurality of first transfer electrodes 3 and accumulating signal charges are disposed side-by-side in the row direction of the matrix in which the plurality of pixels 13B are disposed.

As illustrated in FIG. 17, second pixels 13Bb are disposed so as to be flipped on a column-by-column and row-by-row basis in the matrix in which the plurality of pixels 13B are disposed.

Additionally, although second pixel 13Ab according to Embodiment 3 includes one readout electrode 2, one exposure control electrode 6, and one charge emitter 7 for a single photoelectric converter 2, second pixel 13Bb includes two readout electrodes 2, namely readout electrode 2a and readout electrode 2b, two exposure control electrodes 6, namely exposure control electrode 6a and exposure control electrode 6b, and two charge emitters 7, namely charge emitter 7a and charge emitter 7b, for a single photoelectric converter 1. Here, with respect to photoelectric converter 1, a positional relationship between readout electrode 2a and readout electrode 2b, a positional relationship between exposure control electrode 6a and exposure control electrode 6b, and a positional relationship between charge emitter 7a and charge emitter 7b, are symmetrical with respect to the column direction.

Second pixel 13Bb shares floating diffusion layer 4 with one of first pixels 13Ba arranged in the column direction.

In pixels 13B having the above-described configuration, a charge accumulator is formed by first transfer electrodes 3 and second transfer electrode 9 to which a high voltage is applied and transfer channels 8a and 8b provided under those electrodes. Here, the descriptions will be given assuming that each charge accumulator is driven in five phases as an example. Accordingly, four types of signal charges can be accumulated in a single pixel. In addition, a plurality of (e.g., two) readout electrodes 2, a plurality of (e.g., two) exposure control electrodes 6, and a plurality of (e.g., two) charge emitters 7 are included for a single photoelectric converter 1.

As a result, two types of signal charges can be accumulated in a single exposure sequence, which makes it possible to suppress the number of times the pulsed infrared light is emitted and, by extension, reduce the amount of power consumed by light emission.

Additionally, as described above, the order in which output control electrode 10, floating diffusion layer 4, and readout circuit 5 included in each first pixel 13Ba are disposed with respect to the row direction is flipped on a column-by-column and row-by-row basis in the horizontal direction.

Accordingly, the arrangement of signal charges A0 to A3 can be aligned within a single horizontal scanning period.

In FIG. 17, electrodes given the same reference sign (e.g., VG1-$m$, VG2-$m$, VG3-$m$, VG4-$m$, and so on) are connected to the same control line.

Figure 18:
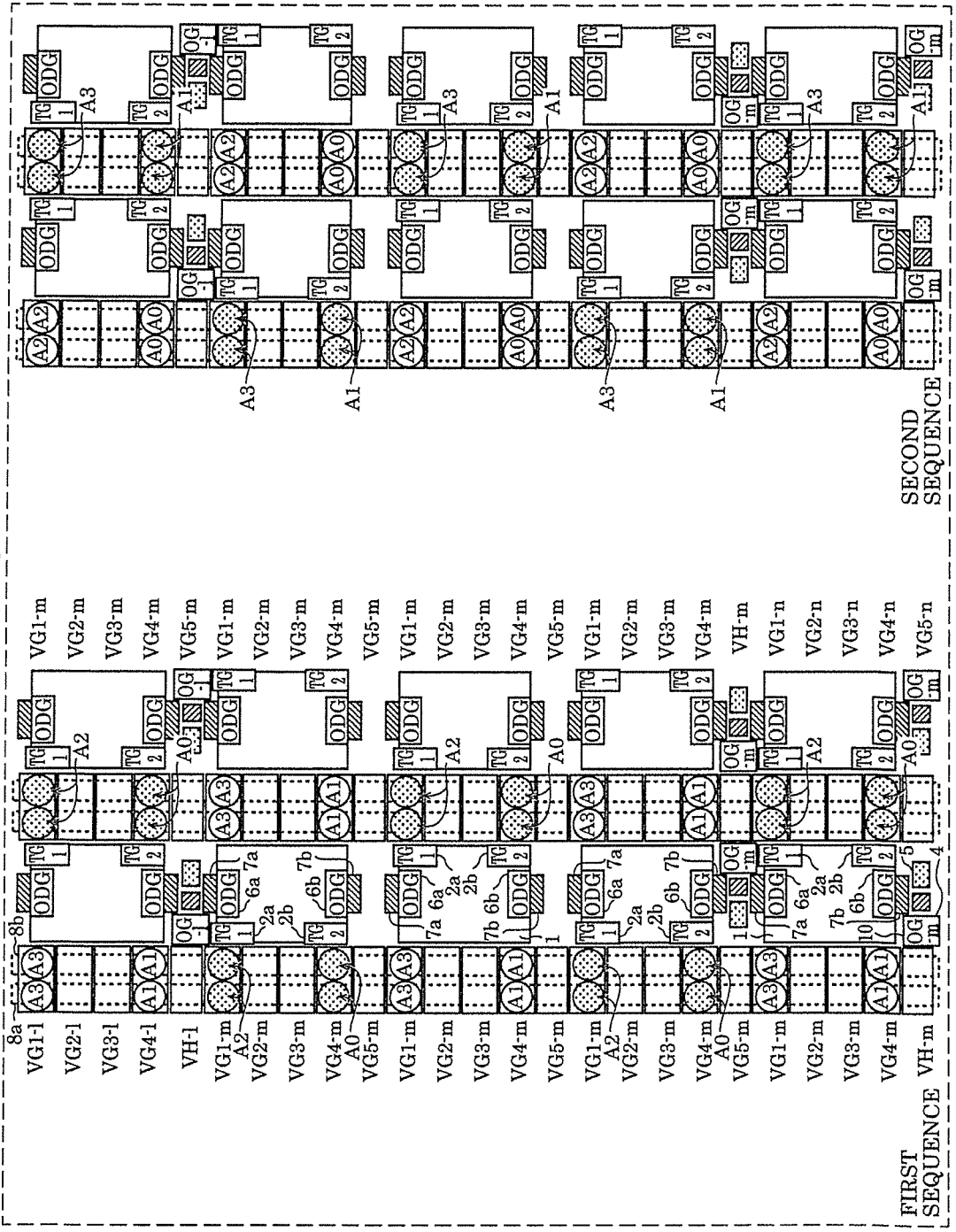
FIG. 18 is a schematic plan view illustrating operations in an exposure period of the solid-state imaging device according to Embodiment 4.
Figure 19A:
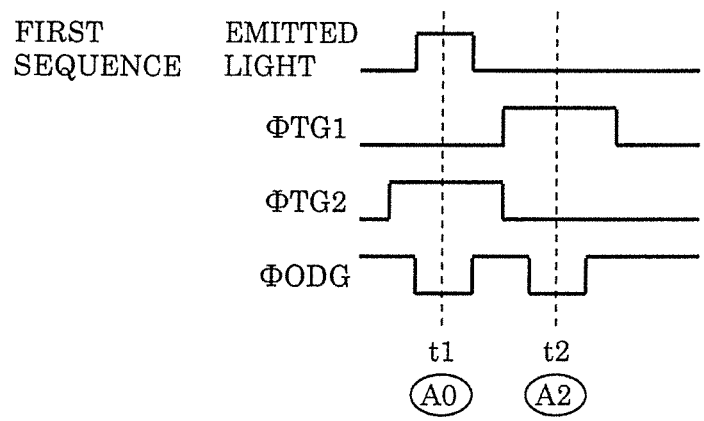
FIG. 19A is a driving timing chart illustrating operations in the exposure period of the solid-state imaging device according to Embodiment 4.
Figure 19B:
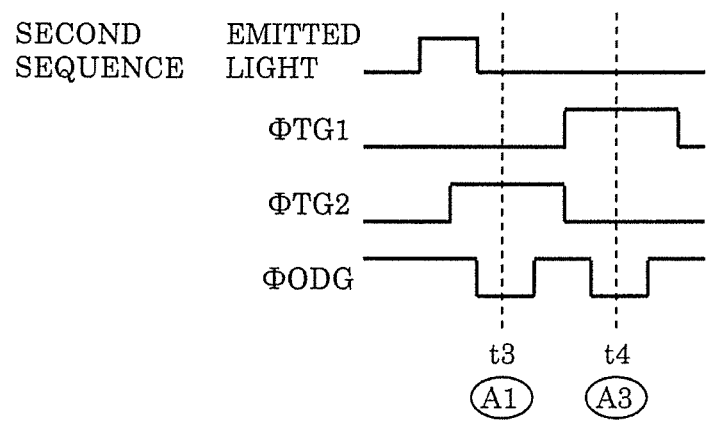
FIG. 19B is a driving timing chart illustrating operations in the exposure period of the solid-state imaging device according to Embodiment 4.

FIG. 18 is a schematic plan view illustrating operations during an exposure period of the solid-state imaging device according to Embodiment 4, and FIGS. 19A and 19B are driving timing charts illustrating operations during the exposure period of the solid-state imaging device according to Embodiment 4.

Operations of the solid-state imaging device according to Embodiment 4 during the exposure period will be described next with reference to FIGS. 18, 19A, and 19B.

Drive pulse ΦODG is applied to each of exposure control electrodes 6; and drive pulses ΦTG1 and ΦTG2, to each readout electrode 2. Although not illustrated in FIGS. 18, 19A, and 19B, during exposure, a high voltage is applied for applied pulse ΦVG1 of first transfer electrode 3a and applied pulse ΦVG4 of first transfer electrode 3d, and a low voltage is applied for the applied pulse of the other first transfer electrodes 3. The charges can be accumulated under first transfer electrodes 3 to which the high voltage has been applied, and a charge accumulator is formed. Additionally, pulsed infrared light that repeatedly turns on and off at a constant cycle is repeatedly emitted from light source 500.

In an initial state, exposure control electrode 6 is in the high state and readout electrode 2 is in the low state, and the signal charge generated by photoelectric converter 1 is output to charge emitter 7 via exposure control electrode 6.

In the first and second sequences illustrated in FIGS. 19A and 19B, the timings of drive pulses ΦODG, ΦTG1, and ΦTG2, which are synchronized with the emitted light, are different.

In the first sequence illustrated in FIG. 19A, signal charge A0 obtained at time t1 and signal charge A2 obtained at time t2 are accumulated, and this is repeated a plurality of times.

Although not illustrated, a five-phase drive pulse is applied to first transfer electrodes 3, and the signal charges are transferred downward in the column direction, for all pixels 13B in image capturing unit 101 simultaneously when transitioning from the first sequence to the second sequence.

In the second sequence illustrated in FIG. 19B, signal charge A1 obtained at time t3 and signal charge A3 obtained at time t4 are accumulated, and this is repeated a plurality of times.

Although not illustrated, a five-phase drive pulse is applied to first transfer electrodes 3, and the signal charges are transferred upward in the column direction, for all pixels 13B in image capturing unit 101 simultaneously when transitioning from the second sequence to the first sequence.

In the exposure period, each of the first and second sequences repeated a plurality of times is taken as a single set, and the set is repeated a plurality of times.

In this manner, in the exposure period within a single frame period, potentials of each of the corresponding first transfer electrodes 3 change in the same manner for all of the plurality of pixels 13B.

Figure 20:
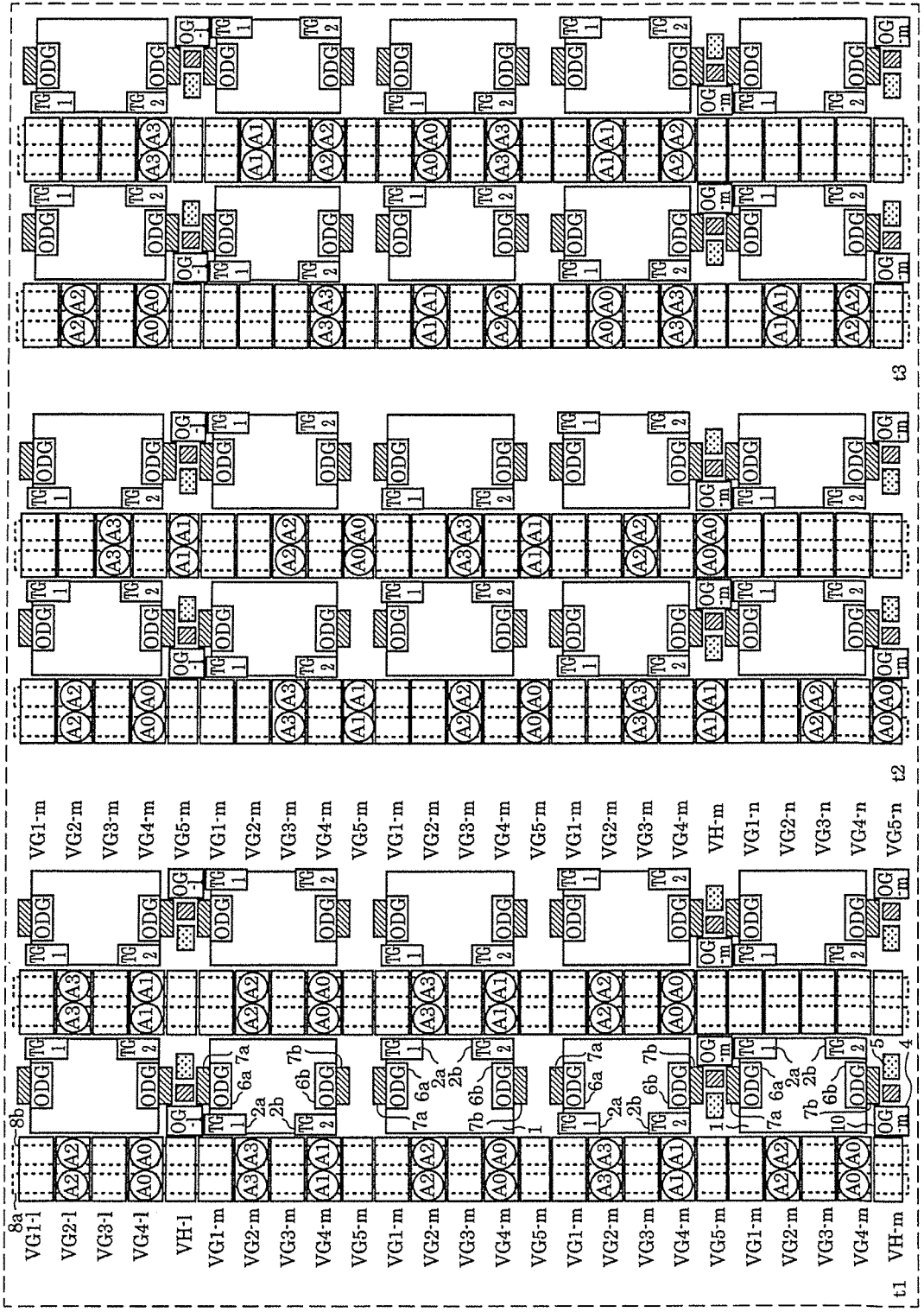
FIG. 20 is a schematic plan view illustrating operations in a transfer period of the solid-state imaging device according to Embodiment 4.
Figure 21:
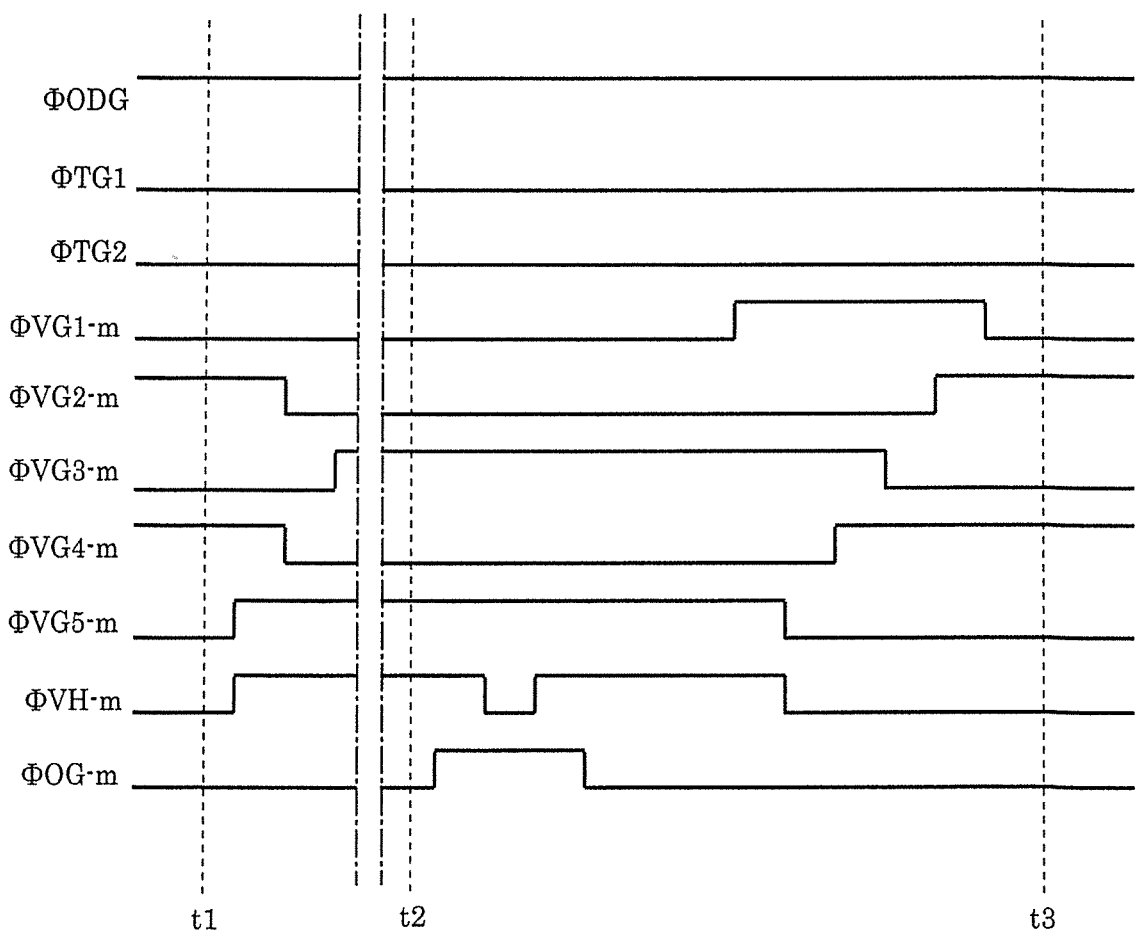
FIG. 21 is a driving timing chart illustrating operations in the transfer period of the solid-state imaging device according to Embodiment 4.

FIG. 20 is a schematic plan view illustrating operations during the transfer period of the solid-state imaging device according to Embodiment 4, and FIG. 21 is a driving timing chart illustrating operations during the transfer period of the solid-state imaging device according to Embodiment 4.

Operations of the solid-state imaging device according to Embodiment 4 during the transfer period will be described next with reference to FIGS. 20 and 21.

Focusing on row m (the second row from the top to the fifth row from the top in the column on the left side in FIG. 20, and the first row from the top to the fourth row from the top in the column on the right side in FIG. 20), at initial time t1, first transfer electrodes 3b (VG2-m in FIG. 17) and first transfer electrodes 3d (VG4-m in FIG. 17) are in the high state, and signal charges A0 to A3 are accumulated under first transfer electrodes 3b and first transfer electrodes 3d.

Next, signal charges A0 to A3 are transferred downward in the column direction (t2) in response to a five-phase drive pulse being applied to first transfer electrodes 3a to 3e and second transfer electrode 9 in row m (VG1-m to VG5-m and VH-m in FIG. 17).

Next, signal charge A0 is transferred to floating diffusion layer 4 in response to drive pulses being applied to second transfer electrode 9 (VH-m in FIG. 17) and output control electrode 10 (OG-m in FIG. 17) in row m, and signal charge A0 transferred to floating diffusion layer 4 is read out via readout circuit 5.

Next, signal charges A0 to A3 are transferred downward in the column direction (t3) in response to a five-phase drive pulse being applied to first transfer electrodes 3a to 3e and second transfer electrode 9 in row m (VG1-m to VG5-m and VH-m in FIG. 17).

Next, although not illustrated, the remaining signal charges A0 to A3 are read out in the same manner as signal charge A0 by repeating the operations from t1 to t3, and the distance to the subject is calculated using signal charges A0 to A3.

Here, unlike the exposure period, in the transfer period, during the period in which row m operates (the second row from the top to the fifth row from the top in the column on the left side in FIG. 20, and the first row from the top to the fourth row from the top in the column on the right side in FIG. 20), only pixels 13B in row m operate, and the operations of the other pixels 13B are stopped.

According to the solid-state imaging device of Embodiment 4 as described thus far, by including a plurality of (e.g., two) transfer channels 8 for each of first transfer electrodes 3, four types of signal charges can be accumulated for a single pixel, and thus a range image having a better resolution than that of the solid-state imaging device according to Embodiment 3 can be obtained. Furthermore, by including a plurality of (e.g., two) readout electrodes 2, a plurality of (e.g., two) exposure control electrodes 6, and a plurality of (e.g., two) charge emitters 7 for a single photoelectric converter 1, a plurality of types (e.g., two types) of signal charges can be accumulated in a single exposure sequence. This makes it possible to suppress the number of times the pulsed infrared light is emitted and, by extension, reduce the amount of power consumed by light emission, more than with the solid-state imaging device according to Embodiment 3.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely applied in solid-state imaging devices that obtain an image of a subject.

What is claimed is:

1. A solid-state imaging device, comprising:
a plurality of pixels arranged in rows each of which extends in a first direction and in columns each of which extends in a second direction perpendicular to the first direction, the plurality of pixels each including a photoelectric converter that converts received light into a signal charge, and a first transfer electrode that (i) accumulates the signal charge that is read out from the photoelectric converter in the first direction and (ii) transfers the signal charge in the second direction; and
a control line connected in common to the first transfer electrodes of pixels each arranged along the first direction,
characterized in that one or more of the plurality of pixels which are arranged in matrix form are floating diffusion layer-including pixels having a floating diffusion layer that accumulates the transferred signal charge, and one or more of the plurality of pixels which are arranged in matrix form in a row adjacent to the row of the floating diffusion layer-including pixels with respect to the column direction, are second pixels not having a floating diffusion layer, and
the control line is connected in common to each of the first transfer electrodes of the floating diffusion layer-including pixels and to the second pixel arranged in a column direction with respect to the floating diffusion layer-including pixel, the second pixel sharing the floating diffusion layer of the floating diffusion layer-including pixel.

2. The solid-state imaging device according to claim 1, wherein each of the plurality of pixels includes a plurality of the first transfer electrodes, and the solid-state imaging device comprises a plurality of the control lines respectively connected to the plurality of first transfer electrodes in the pixel.

3. The solid-state imaging device according to claim 1, wherein the pixels receive infrared light.

4. The solid-state imaging device according to claim 1, wherein of two or more of the pixels arranged in the column direction and sharing the floating diffusion layer, the pixel at one of one end and another end with respect to the column direction is the floating diffusion layer-including pixel.

5. The solid-state imaging device according to claim 2, wherein in two or more of the pixels arranged in the column direction and sharing at least one of the floating diffusion layers, the signal charges read out from respective ones of the photoelectric converters are added under at least one of the plurality of first transfer electrodes included in the two or more of the pixels.

6. The solid-state imaging device according to claim 1, wherein each of the pixels includes k (where k is an integer of 2 or greater) transfer channels, the transfer channels running under the first transfer electrodes and accumulating the signal charges, and the transfer channels being arranged in the row direction of an arrangement of the plurality of pixels.

7. The solid-state imaging device according to claim 2, wherein each of the floating diffusion layer-including pixels further includes a second transfer electrode disposed adjacent to one of the plurality of first transfer electrodes with respect to the column direction, and an output control electrode disposed adjacent to the second transfer electrode with respect to the row direction of an arrangement of the plurality of pixels and that transfers the signal charge to the floating diffusion layer, and the second transfer electrode transfers the signal charge in the column direction and the row direction.

8. The solid-state imaging device according to claim 7, wherein the second transfer electrodes in the floating diffusion layer-including pixels adjacent in the row direction transfer the signal charges in mutually-opposite directions with respect to the row direction.

9. The solid-state imaging device according to claim 7, wherein an arrangement order, with respect to the row direction, of the output control electrodes, the floating diffusion layers, and readout circuits that read out the signal charges accumulated in the floating diffusion layers, that are included in the floating diffusion layer-including pixels, is reversed on a column-by-column and a row-by-row basis.

10. The solid-state imaging device according to claim 7, wherein the output control electrodes having a same potential are disposed adjacent to both ends of the second transfer electrode with respect to the row direction.

11. The solid-state imaging device according to claim 1, wherein in pixels arranged in the column direction and that share the floating diffusion layer, potentials of the plurality of first transfer electrodes change in the same manner as each other.

12. The solid-state imaging device according to claim 1, wherein the floating diffusion layer-including pixels are arranged in rows in which the plurality of floating diffusion layers are arranged in the arrangement of the plurality of pixels, in an exposure period within a single frame period, a potential of each of the plurality of first transfer electrodes that correspond to each other changes in the same manner for all of the plurality of pixels, in a transfer period within the single frame period, potentials of mutually-corresponding ones of the plurality of first transfer electrodes change in the same manner in units of pixel groups, each pixel group including the floating diffusion layer-including pixels arranged in a single one of the rows in which the floating diffusion layers are arranged and pixels sharing the floating diffusion layers included in the floating diffusion layer-including pixels, and in a period when the potentials of the first transfer electrodes in one of the pixel groups are changing, the potentials of the first transfer electrodes in another of the pixel groups do not change.

13. An imaging device, comprising:
the solid-state imaging device according to claim 1;
a light source that emits infrared light in pulses at a plurality of timings in each of exposure periods within a single frame period; and
a processor that generates a range image based on an output signal from the solid-state imaging device.

14. A solid-state imaging device, comprising:
a plurality of pixels, each including a photoelectric converter that converts received light into a signal charge, and a first transfer electrode that (i) accumulates the signal charge that is read out from the photoelectric converter in a first direction and (ii) transfers the signal charge in a second direction perpendicular to the first direction; and
a control line connected in common to the first transfer electrodes of pixels arranged in a row direction,
characterized in that one or more of the plurality of pixels which are arranged in matrix form are floating diffusion layer-including pixels having a floating diffusion layer that accumulates the transferred signal charge, and one or more of the plurality of pixels which are arranged in matrix form in a row adjacent to the row of the floating diffusion layer-including pixels with respect to the column direction, are second pixels not having a floating diffusion layer, and
the control line is connected in common to each of the first transfer electrodes of the floating diffusion layer-including pixels and to the second pixel arranged in a column direction with respect to the floating diffusion layer-including pixel, the second pixel sharing the floating diffusion layer of the floating diffusion layer-including pixel,
wherein each of the pixels includes k (where k is an integer of 2 or greater) transfer channels, the transfer channels running under the first transfer electrodes and accumulating the signal charges, and the transfer channels being arranged in the row direction of an arrangement of the plurality of pixels.

15. The solid-state imaging device according to claim 1, wherein the first direction and the second direction extend in a same plane or in parallel planes.

* * * * *